(12) United States Patent
Kanesaka

(10) Patent No.: US 6,304,521 B1
(45) Date of Patent: Oct. 16, 2001

(54) THERMOELECTRIC GENERATING ELECTRONIC TIMEPIECE

(75) Inventor: Toshiya Kanesaka, Chiba (JP)

(73) Assignees: Seiko Instruments Inc.; Seiko Instruments R&D Center Inc., both of (JP)

(*) Notice: Subject to any disclaimer, the term of this patent is extended or adjusted under 35 U.S.C. 154(b) by 0 days.

(21) Appl. No.: 09/439,828

(22) Filed: Nov. 12, 1999

(30) Foreign Application Priority Data

| Nov. 13, 1998 | (JP) | 10-323819 |
|---|---|---|
| Nov. 13, 1998 | (JP) | 10-323820 |
| Nov. 13, 1998 | (JP) | 10-323822 |
| Nov. 4, 1999 | (JP) | 11-314023 |

(51) Int. Cl.[7] .............. G04B 37/00; A44C 5/00; H01L 35/00
(52) U.S. Cl. .......... 368/204; 368/203; 368/276; 368/281; 368/282; 136/205
(58) Field of Search .................. 368/203, 204, 368/276, 281, 282; 136/205, 242

(56) References Cited

U.S. PATENT DOCUMENTS

| 4,106,279 | * | 8/1978 | Martin et al. | 368/204 |
|---|---|---|---|---|
| 4,178,751 | * | 12/1979 | Liautaud | 368/281 |
| 4,194,355 | * | 3/1980 | Nishida | 368/282 |
| 4,213,292 | * | 7/1980 | Dolezal et al. | 368/204 |
| 4,690,567 | * | 9/1987 | Rebeaud | 368/282 |
| 4,903,253 | * | 2/1990 | Nikles et al. | 368/282 |
| 5,065,374 | * | 11/1991 | Soder et al. | 368/282 |
| 5,181,192 | * | 1/1993 | Paratte et al. | 368/282 |
| 5,705,770 | * | 1/1998 | Ogasawara et al. | 136/205 |

FOREIGN PATENT DOCUMENTS

| 7589/61 | * | 1/1964 | (CH) | 368/204 |
|---|---|---|---|---|
| 837377A1 | | 4/1998 | (EP) . | |
| 2310589 | | 12/1976 | (FR) . | |
| 53-13951 | * | 2/1978 | (JP) | 368/203 |

OTHER PUBLICATIONS

Patent Abstracts of Japan, vol. 1998, No. 9, Publication No: 10111368, Apr. 28, 1998, Jul. 31, 1998.
Patent Abstracts of Japan, vol. 018, No. 387, (P–1773), Publication No:06109868, Apr. 22, 1994, Jul. 20, 1994.

* cited by examiner

Primary Examiner—Vit Miska
Assistant Examiner—Jeanne-Marguerite Goodwin
(74) Attorney, Agent, or Firm—Adams & Wilks

(57) ABSTRACT

A thermoelectric generating electronic timepiece comprises a thermoelectric generator for generating electric power in response to a temperature difference thereacross. A heat radiating case is thermally connected to a cold pole of the thermoelectric generator for radiating heat. A heat absorbing case is thermally connected to a hot pole of the thermoelectric generator for absorbing heat. A heat insulating case thermally insulates the heat absorbing case and the heat radiating case. A band is provided for securing the thermoelectric generating electronic timepiece to the arm of a user. The band has a heat absorbing member thermally connected to the heat absorbing case for absorbing heat and a heat insulating member for restraining radiation and transfer of heat.

35 Claims, 22 Drawing Sheets

THERMOELECTRIC GENERATING ELECTRONIC TIMEPIECE

BACKGROUND OF THE INVENTION

1. Field of the Invention

The present invention relates to an electronic timepiece having a thermoelectric generator.

2. Description of the Prior Art

In a thermoelectric type electronic timepiece for generating electricity by using a thermoelectric generator as an energy source of the timepiece, a thermoelectricity generating element for generating electricity by using the Seebeck effect is arranged on an inner side of a case. Heat of the above thermoelectric generator is absorbed from an arm and is radiated to the outside air so that a temperature difference is provided. Electricity is generated by this temperature difference. Generated electric energy is accumulated to an accumulator and is used as an energy source for driving the timepiece (for example, see Japanese Examined Patent Publication No. 2-13279). In another example, there is an electronic timepiece having a structure in which the thermoelectricity generating element is arranged within a band (for example, see Japanese Laid-Open (Kokai) Patent No. 6-109868).

In an electronic timepiece having a conventional thermoelectric generator, when the above electronic timepiece is mounted to an arm, heat of this thermoelectric generator is absorbed from the arm and is radiated to the outside air so that a temperature difference is obtained and electricity is generated. Generated electric power is accumulated to the accumulator. When the above electronic timepiece is detached from the arm, electricity generation is stopped when no temperature difference is obtained. While the electricity generation is stopped, the electric power accumulated to the accumulator is consumed and the above electronic timepiece is operated by this electric power. Therefore, a problem exists in that a large temperature difference must be given between a cold pole and a hot pole of the thermoelectric generator at an electricity generating time to efficiently generate electricity and accumulate more electric power while the above electronic timepiece is mounted to the arm.

SUMMARY OF THE INVENTION

The thermoelectric generating electronic timepiece of the present invention has a heat radiating case thermally connected to a cold pole of a thermoelectric generator and radiating heat to the atmosphere, a heat absorbing case thermally connected to a hot pole of the thermoelectric generator and absorbing heat, a heat insulating case for insulating heat between the heat absorbing case and the heat radiating case, a band, and connecting means for connecting the heat absorbing case and the band. In this construction, heat is absorbed from both the heat absorbing case and the band.

The heat absorbing case and the band are integrated with each other so as to reduce heat loss due to a connection of the band and the heat absorbing case. One portion of the band comes in contact with the heat absorbing case or is arranged in proximity to the heat absorbing case so as to reduce heat loss due to the connection of the band and the heat absorbing case. The band is constructed by a heat absorbing member for easily absorbing heat from at least an arm and having a good heat transfer property, and a heat insulating member for restraining radiation and transfer of the absorbed heat. The heat insulating member is arranged on a heat radiating side of the heat absorbing member to restrain heat radiated from the band. The heat transfer member and the heat absorbing case are thermally connected to each other so as to easily conduct heat from the heat transfer member to the heat absorbing case. The heat transfer member for reducing heat loss due to the connection is used in the connecting means. Thus, a heat absorbing area is increased and heat radiated from the band can be restrained, and the heat loss due to the connection of the band and the heat absorbing case is reduced so that a heat absorbing amount is increased. Accordingly, a large temperature difference is given to the thermoelectric generator.

The thermoelectric generating electronic timepiece of the present invention has also a thermoelectric generator for generating electricity by giving a temperature difference, a heat radiating case thermally connected to a cold pole of the thermoelectric generator and radiating heat, a heat absorbing case thermally connected to a hot pole of the thermoelectric generator and absorbing heat, a heat insulating case for thermally insulating the heat absorbing case and the heat radiating case, a band for fixing the timepiece to an arm, and connecting means for connecting the heat radiating case and the band. In this construction, heat is radiated from both the heat radiating case and the band.

The heat absorbing case and the band are integrated with each other so as to reduce heat loss due to a connection of the band and the heat radiating case.

One portion of the band comes in contact with the heat radiating case or is arranged in proximity to the heat radiating case so as to reduce heat loss due to the connection of the band and the heat radiating case.

The band is constructed by a heat insulating member having a good heat insulating property so as not to easily absorb heat from at least the arm, and a heat radiating member for easily radiating the absorbed heat. The heat insulating member is arranged on an arm side of the heat radiating member to restrain heat absorbed from the band.

Further, a heat transfer member for reducing heat loss due to the connection is used in the connecting means.

Thus, a heat radiating area is increased and heat radiated from the band can be added to heat radiated from the heat radiating case, and the heat loss due to the connection of the band and the heat radiating case is reduced so that a heat radiating amount is increased. Accordingly, a large temperature difference can be given to the thermoelectric generator.

The thermoelectric generating electronic timepiece of the present invention further has a heat radiating case thermally connected to a cold pole of a thermoelectric generator and radiating heat to the atmosphere, a heat absorbing case thermally connected to a hot pole of the thermoelectric generator and absorbing heat, a heat insulating case for insulating heat between the heat absorbing case and the heat radiating case, a band for mounting a timepiece to an arm, and connecting means for connecting the heat insulating case and the band. In this construction, heat flowing from the band to the heat radiating case and the heat absorbing case is insulated.

Further, heat is insulated by integrating the band and the heat insulating case.

The band, the heat absorbing case and the heat radiating case are separated from each other to increase heat loss due to a connection of the band and the heat radiating case.

Further, one portion of the band is set to a heat insulating member for insulating transfer of heat to increase heat loss from the band to a timepiece body.

Further, the connecting means is set to a heat insulating member to increase the heat loss from the band to the timepiece body.

Thus, a thermal influence at an attaching time of the band to the timepiece body is reduced by increasing the heat loss between the band and the timepiece body. Accordingly, a quantity of heat flowing to the thermoelectric generator is increased so that a large temperature difference is given to the thermoelectric generator.

Further, a heat absorbing portion, a heat radiating portion and a heat insulating portion are arranged in the band. The heat radiating portion and the heat radiating case come in contact with each other, or are arranged in proximity to each other so that a heat radiating amount is increased. The heat absorbing portion and the heat absorbing case come in contact with each other, or are arranged in proximity to each other so that a heat absorbing amount is increased. Further, the heat radiating portion and the heat absorbing portion of the band are thermally insulated from each other so that no heat easily directly flows. Thus, the heat absorbing amount and the heat radiating amount are increased so that a quantity of heat flowing to the thermoelectric generator is increased. Accordingly, a large temperature difference is given to the thermoelectric generator.

BRIEF DESCRIPTION OF THE DRAWINGS

A preferred form of the present invention is illustrated in the accompanying drawings in which.

DETAILED DESCRIPTION OF THE PREFERRED EMBODIMENTS

Figure 1:
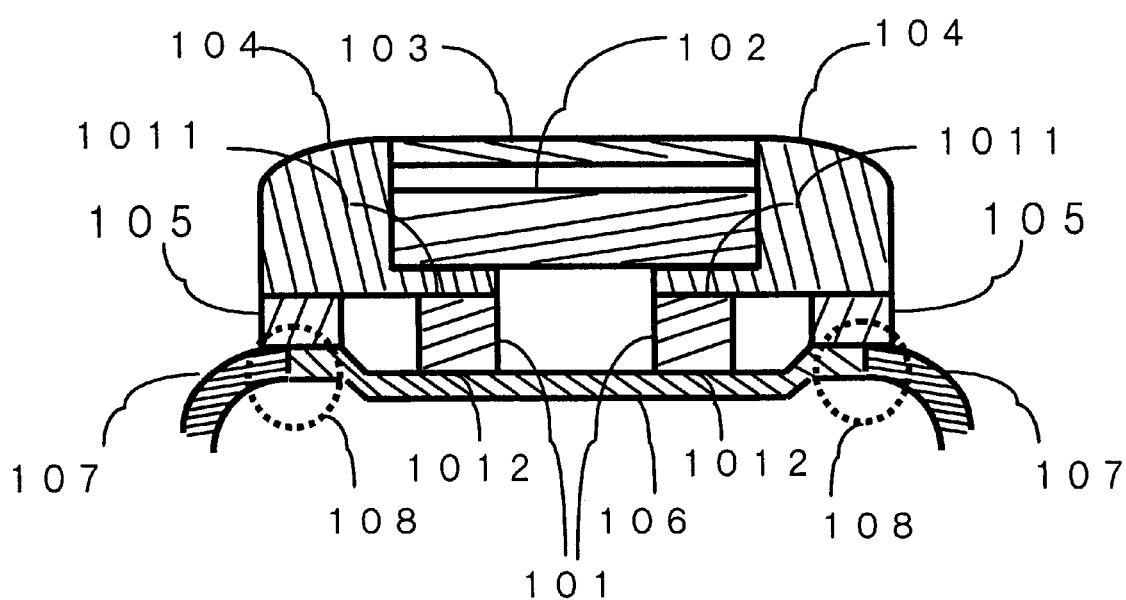
FIG. 1 is a cross-sectional view showing a structure of a thermoelectric generating electronic timepiece showing a first embodiment mode of the present invention.

FIG. 1 is a cross-sectional view showing a structure of a thermoelectric generating electronic timepiece showing a first embodiment mode of the present invention. The thermoelectric generator 101 is a thermoelectric generator for generating electricity by flowing heat to this thermoelectric generator. There is a thermoelectric generator utilizing the Seebeck effect as one example of the thermoelectric generator 101. The thermoelectric generator 101 can use a construction in which a P-type thermoelectric material element and an N-type thermoelectric material element are nipped between two insulating substrates, and are connected to each other on these insulating substrates through a conductive substance such as a metal, etc. In this construction, a plurality of thermoelectric material elements are connected in series such as P, N, P, N, P, N, - - - . When a temperature difference is given between both the above substrates, heat flows and electromotive force of a voltage according to the temperature difference is caused. The electromotive force of a high voltage can be obtained by increasing the number of PN connections. The temperature difference for generating electricity is obtained by the difference between a body temperature and a temperature of the outside air when the timepiece is mounted to an arm. A movement 102 is a movement of a well-known electronic timepiece having an accumulator such as a secondary battery, a capacitor, etc., an oscillating means, a frequency dividing means, a display driving circuit and a display means. Electric energy generated by the thermoelectric generator 101 is accumulated to the accumulator and is converted to driving energy of the movement 102. Electric power generated by the thermoelectric generator 101 can be converted to a voltage used to drive the electronic timepiece by using a voltage raising-lowering circuit and can be also accumulated to the accumulator. A windshield glass 103 is fixed to a heat radiating case 104. The heat radiating case 104 is connected to a cold pole 1011 of the thermoelectric generator 1 01 and radiates heat radiated from the cold pole 1011 of the thermoelectric generator 1 01 to the outside air. A material of the heat radiating case 104 is preferably formed by a metal such as stainless steel, an iron alloy, aluminum, an aluminum alloy, a copper alloy, a titanium alloy, etc. since these metals easily conduct heat. A heat absorbing case 106 is connected to a hot pole 1012 of the thermoelectric generator 101 and conducts heat from the arm to the hot pole 1012 of the thermoelectric generator 101 when the timepiece is mounted to the arm. A heat insulating case 105 is arranged between the heat radiating case 104 and the heat absorbing case 106, and interrupts heat from the heat absorbing case 106 so as not to directly conduct this heat to the heat radiating case 104. The heat insulating case 105 is desirably formed by a material having high heat insulating effects such as plastic, synthetic resin, etc. A band 107 is arranged to mount the timepiece to the arm. A material of the band 107 is desirably constructed by a metal such as stainless steel, aluminum, an aluminum alloy, titanium, a titanium alloy, etc. since these metals easily conduct heat and heat obtained from the arm can be conducted to the heat absorbing case 106 with reduced loss. A connecting portion 108 is a portion that connects the heat absorbing case 106 and the band 107 and is desirably formed by welding, adhesion, connection using a pin, connection using a spring, connection using caulking, connection performed by arranging concave and convex portions, connection using a lever, connection using press-attachment, connection using a screw, connection using a spring bar, connection using a snap operation, connection using a hook, etc. because of the connection and the heat transfer between the absorbing case and the band. In the connecting portion 108, it is desirable to directly connect the heat absorbing case 106 and the band 107 so as to easily conduct heat, but the heat absorbing case 106 and the band 107 may be also connected to each other through a member capable of easily conducting heat. A composite material of a metal and an organic substance may be also used by the band 107 or an inclusion between the absorbing case 106 and the band 107. It is also effective to arrange a heat radiating portion for increasing radiating efficiency of heat to the atmosphere in one portion of an outer circumference of the heat radiating case 104 although this construction is not shown in the drawings.

Next, one example of heat absorbing effects using the band will be explained. The heat resistance of the absorbing case is able to estimate dividing the heat resistance per unit area by the area. The heat resistance of combination of the absorbing case and the band connects parallel in that of the absorbing case, the band and the contact portion between the absorbing case and the band. An area of a heat absorbing portion contacted with the arm is supposed to be 7 cm$^2$ in the heat absorbing case 106, and is supposed to be 15 cm$^2$ in the band 107. A thermal resistance of a contact portion between the arm and the heat absorbing case 106 and a thermal resistance of a contact portion between the arm and the band 107 are supposed to be 100° C./(W·cm$^2$). A thermal resistance in contact between the heat absorbing case 106 and the band 107 is supposed to be 3° C./W. In the case of only the heat absorbing case 106, the thermal resistance between the arm and the heat absorbing case 106 becomes about 14.3° C./W from the above suppositions. In contrast to this, in the case of the heat absorbing case 106 and the band 107, this thermal resistance becomes about 5.8° C./W so that the thermal resistance can be reduced. Accordingly, heat loss absorbed from the arm can be reduced. Here, such values are calculated by neglecting the thermal resistances within the heat absorbing case 106 and the band 107 since these thermal resistances are small. The thermal resistance of contact portion is changed by the manner of mounting this timepiece.

Figure 2:
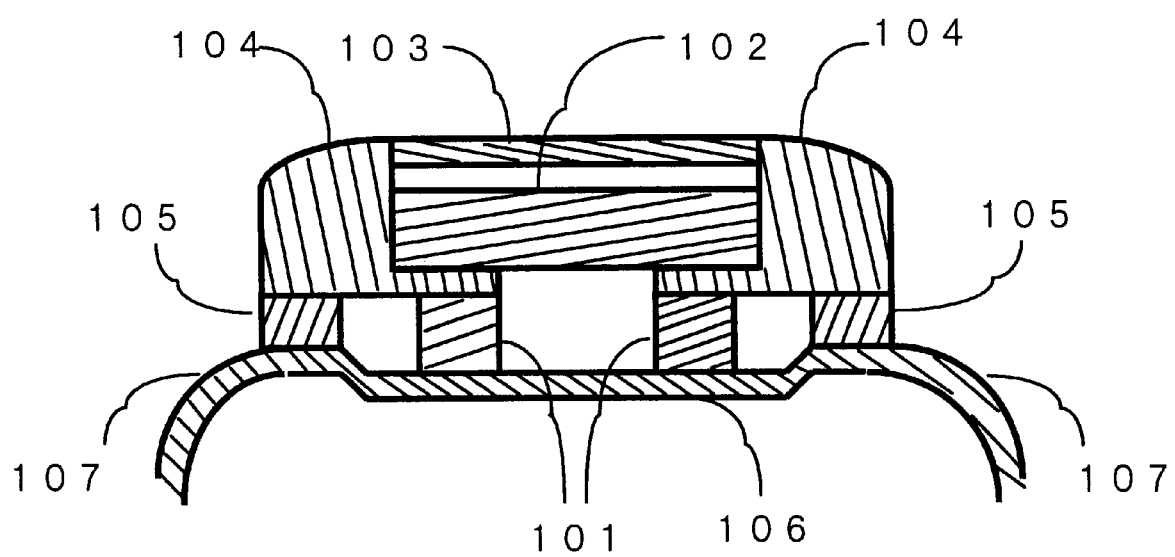
FIG. 2 is a cross-sectional view showing a structure of a thermoelectric generating electronic timepiece showing a second embodiment mode of the present invention.

FIG. 2 is a cross-sectional view showing a structure of a thermoelectric generating electronic timepiece showing a second embodiment mode of the present invention. In the second embodiment mode, loss of thermal connection in a connecting means for connecting the heat absorbing case 106 and the band 107 can be eliminated by integrating the heat absorbing case 106 and the band 107. The other constructions are the same as those in the first embodiment mode. Accordingly, an explanation of these constructions is omitted here.

Figure 3:
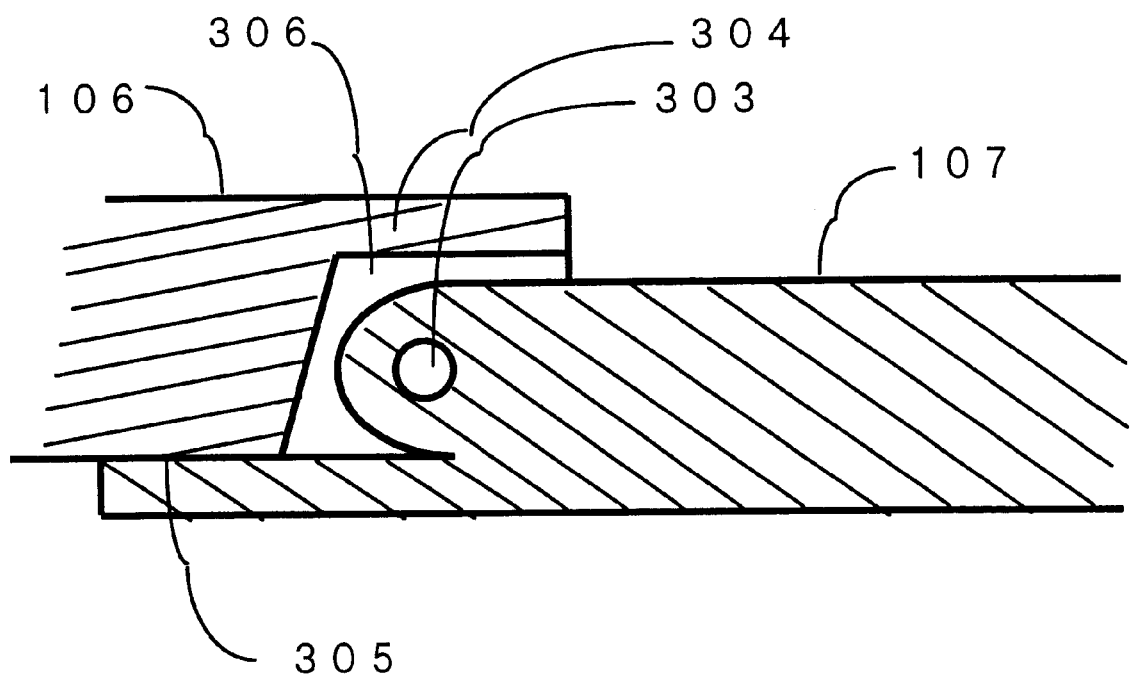
FIG. 3 is a cross-sectional view showing a structure as one example of a connecting portion of a band and a heat absorbing case in the present invention.

FIG. 3 is a cross-sectional view showing a structure as one example of a connecting portion of a band and a heat absorbing case in the present invention. The heat absorbing case 106 absorbs heat from the arm and is generally a rear cover. A clearance 306 is held on a top surface side of the heat absorbing case 106 between the heat absorbing case 106 and the band 107. A cover portion of proximate portion 304 for covering one portion of the band is arranged in the heat absorbing case 106 and receives heat radiated from the band 107. The proximate portion 304 is preferably arranged over an entire width of the heat absorbing case 106, but may be also arranged over one portion of this entire width. It is desirable to set the clearance 306 to be narrow as much as possible. The timepiece is fixed to the arm by the band 107 and the band 107 absorbs heat from the arm. A contact portion 305 in contact with the heat absorbing case 106 is arranged on a lower surface side of the band 107 and conducts the heat absorbed by the band 107 to the heat absorbing case 106. The contact portion 305 is preferably arranged over an entire width of the band 107, but may be also arranged over one portion of this entire width. A hole 303 is formed to connect the heat absorbing case 106 and the band 107 and is generally set to a through hole since a spring bar is inserted into this hole. However, the hole 303 may be also set to a non-through hole, a screw hole, etc. since a band connecting method except for the spring bar can be used.

If at least the contact portion 305 or the proximate portion 304 is arranged, the heat loss between the heat absorbing case 106 and the band 107 can be reduced. Heat is also conducted from the band 107 to the heat absorbing case 106 through the spring bar so that the heat loss is reduced.

Figure 4:
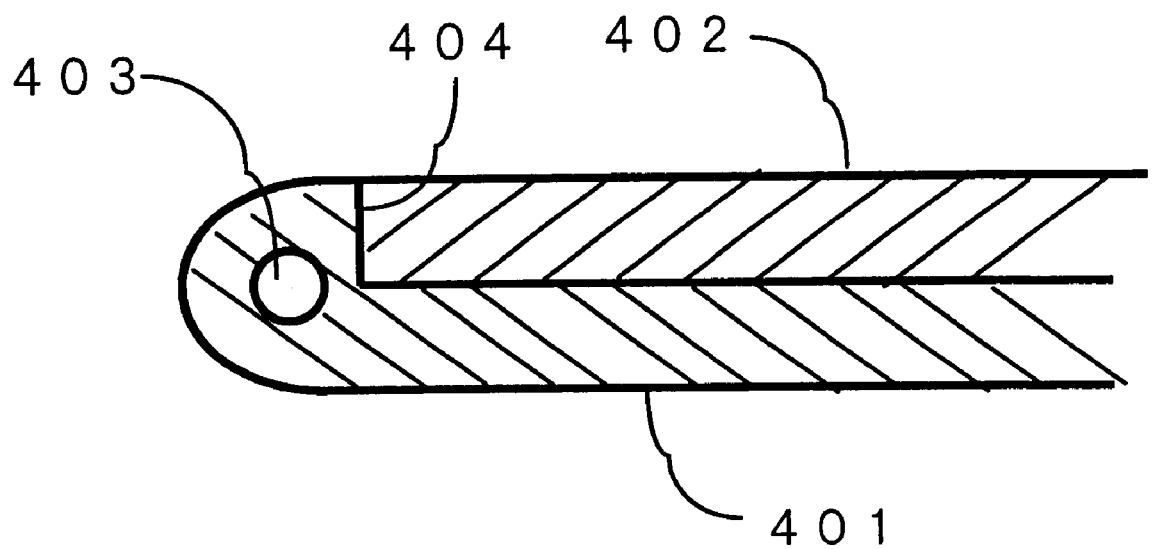
FIG. 4 is a cross-sectional view showing a structure as one example of the band of the present invention.

FIG. 4 is a cross-sectional view showing a structure as one example of the band of the present invention. The band of the present invention is constructed by a heat absorbing member 401 and a heat insulating member 402. The heat absorbing member 401 is formed by a material having good thermal conductivity such as a metallic material, etc. on a side contacted the arm. The heat insulating member 402 is formed by a material having non or bad thermal conductivity such as synthetic resin, etc. to restrain radiation and transfer of heat. A recessed portion 404 is formed on an entire top surface or one portion of the heat absorbing member 401. The heat insulating member 402 is mounted to the recessed portion 404 and is fixed to this recessed portion such that the heat absorbing member 401 and the heat insulating member 402 are not easily separated from each other by adhesion, welding, etc. A hole 403 is formed in the heat absorbing member 401 and is generally set to a through hole since a spring bar is inserted into this hole. However, this hole 403 may be also set to a non-through hole, a screw hole, etc. since a band connecting method except for the spring bar can be used. Heat loss is restrained so as not to make heat escape from the heat absorbing member 401 to the outside air as much as possible so that more heat can be conducted to the heat absorbing case 106.

Figure 5:
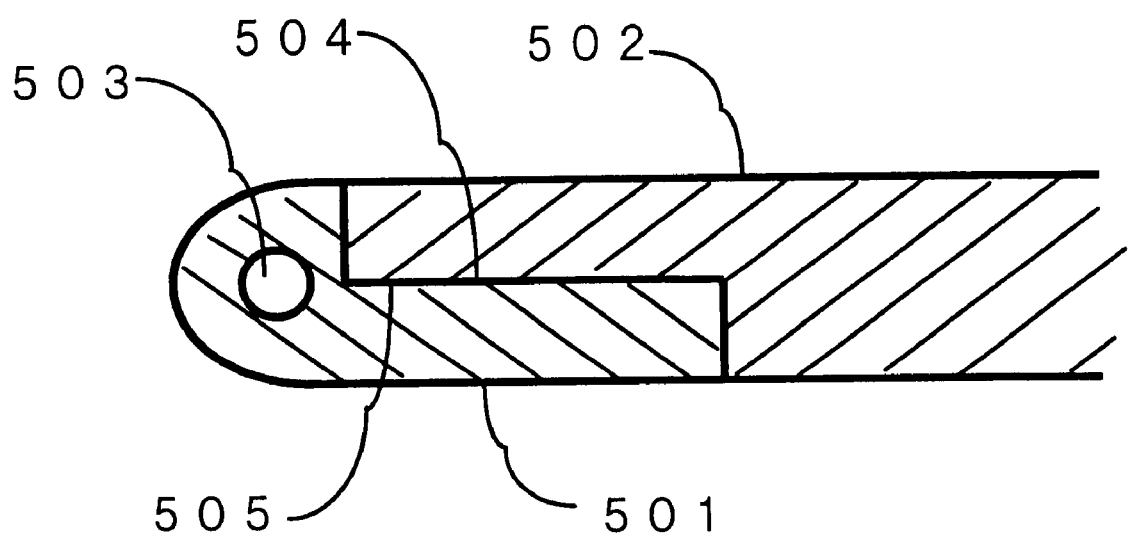
FIG. 5 is a across-sectional view showing a structure as one example of the band of the present invention.

FIG. 5 is a cross-sectional view showing a structure as one example of the band of the present invention. A heat absorbing member 501 and a heat insulating member 502 are arranged in the band of the present invention. The heat absorbing member 501 is formed by a material having good thermal conductivity such as a metallic material on a side contacted the arm. The heat insulating member 502 is formed by a material having non or bad thermal conductivity such as synthetic resin, etc. on a top surface of the heat absorbing member 501 to restrain radiation of heat from the heat absorbing member 501 to the outside air. A recessed portion 504 is formed in the heat insulating member 502 and is partially notched from an end surface of the heat insulating member 502 on its lower surface side. A recessed portion 505 is formed in the heat absorbing member 501 and is partially notched from an end surface of the heat absorbing member 501 on its top surface side. The recessed portion 505 of the heat absorbing member 501 and the recessed portion 504 of the heat insulating member 502 are engaged with each other and are fixed to each other by adhesion, welding, etc. such that the heat absorbing member 501 and the heat insulating member 502 are not easily separated from each other. A hole 503 is formed in the heat absorbing member 501 and is generally set to a through hole since a spring bar is inserted into this hole. However, this hole 503 may be also set to a non-through hole, a screw hole, etc. since a band connecting method except for the spring bar can be used. If the heat absorbing member 501 can reliably come in contact with the arm, an entire length of the heat absorbing member 501 may be arbitrarily set.

Figure 6:
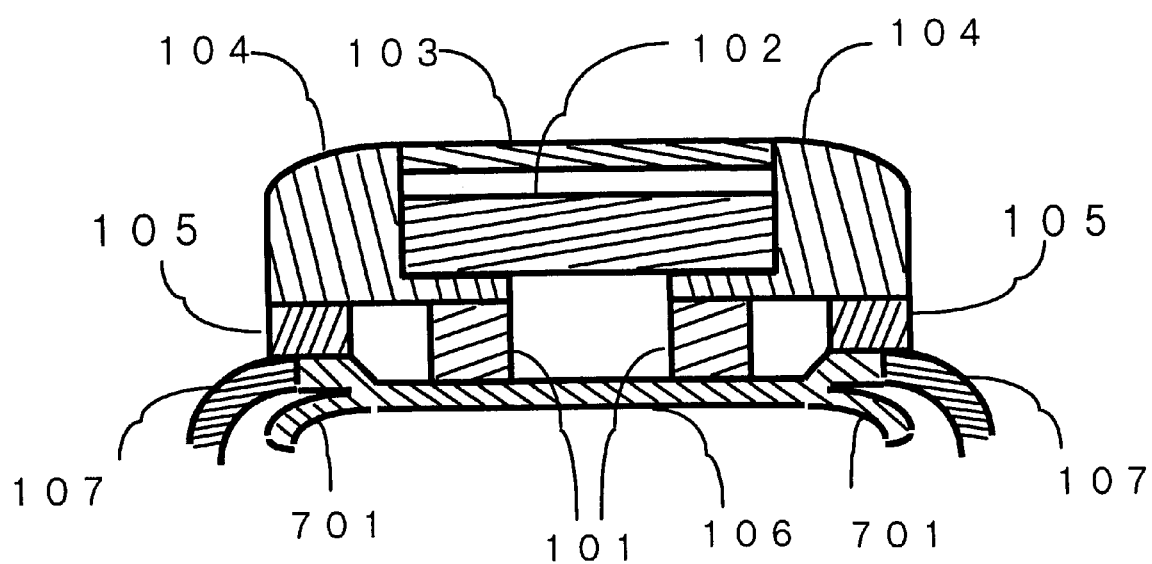
FIG. 6 is a cross-sectional view showing a thermoelectric generating electronic timepiece showing a third embodiment mode of the present invention.

FIG. 6 is a cross-sectional view showing a thermoelectric generating electronic timepiece showing a third embodiment mode of the present invention. In this figure, reference numerals 101 to 107 designate the same portions as FIG. 1. Accordingly, an explanation of these portions is omitted here. A heat absorbing plate 701 is used to increase a contact area with an arm, and is fixedly attached onto an arm side of the heat absorbing case 106. The heat absorbing plate 701 may be deformable in conformity with the arm. A heat absorbing portion having effects similar to those of the heat absorbing plate 701 may be also formed instead of the heat absorbing plate 701 by processing one portion of the heat absorbing case 106. Absorbed heat can be increased by increasing the contact area with the arm and heat loss due to the contact can be also reduced.

Figure 7:
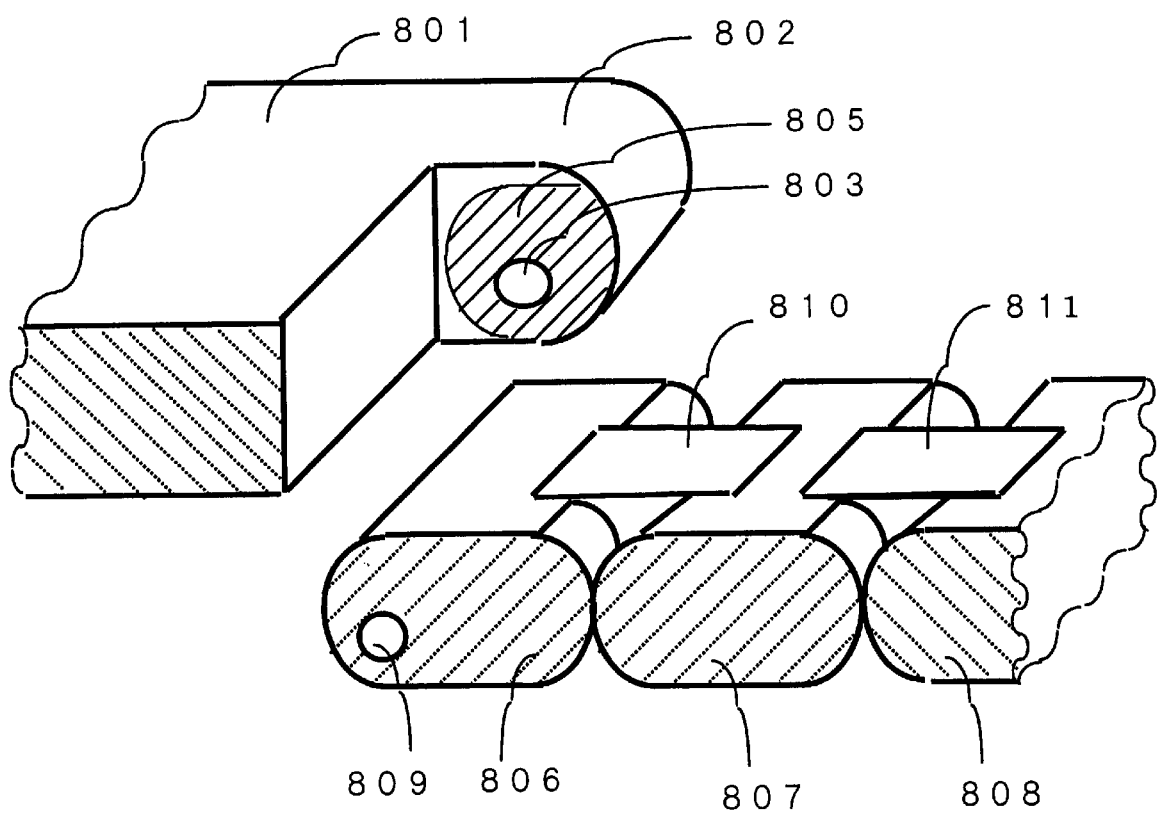
FIG. 7 is a perspective view showing a structure as one example of a connecting portion of the present invention.
Figure 8:
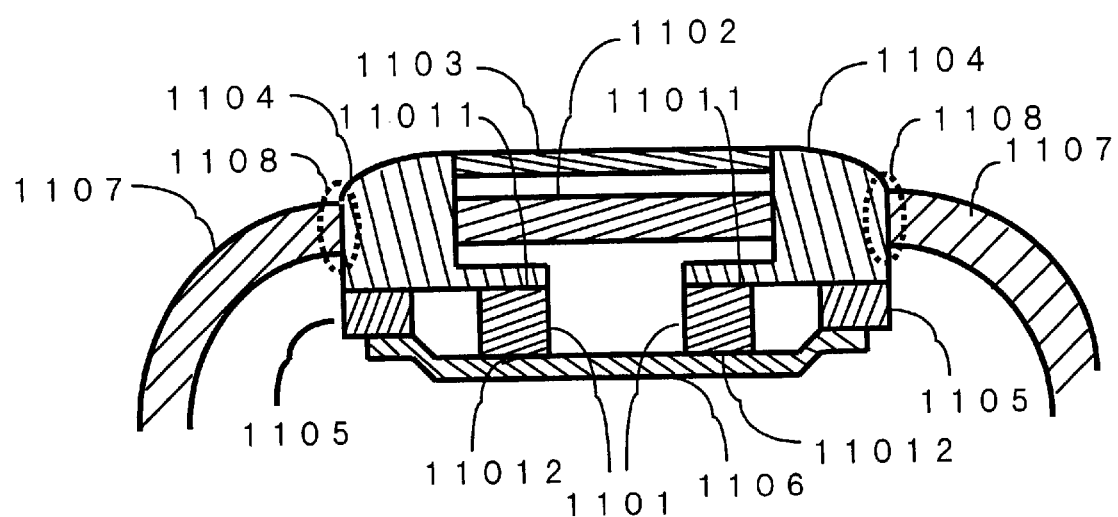
FIG. 8 is a cross-sectional view showing a structure of a thermoelectric generating electronic timepiece showing a fourth embodiment mode of the present invention.

FIG. 7 is a perspective view showing a structure as one example of a connecting portion of the heat absorbing case and the band in the present invention. A heat absorbing case 801 absorbs heat from an arm and is generally a rear cover. A projecting portion 802 for attaching the band is formed in the heat absorbing case 801. A hole 803 for inserting a spring bar thereinto is formed in the projecting portion 802. The heat absorbing case 802 and the band are connected to each other by using the spring bar. In FIG. 8, only one portion of the band is shown. The band is constructed by a plurality of pieces 806, 807, 808 and by a plurality of hinges 810, 811 for connecting the pieces to each other. The pieces can be respectively moved by the hinges. A through hole 809 is formed in a first piece 806 and the first piece 806 is connected to the heat absorbing case 802 through the spring bar. A contact surface 805 comes in contact with a side surface of the first piece 806 so as to easily conduct heat. Heat loss can be reduced by manufacturing the pieces and the hinges constituting the band by a metal having good thermal conductivity. Thus, heat can be easily conducted by manufacturing the pieces and the hinges by a metal. Heat can be absorbed to a certain extent even when all of the pieces and the hinges are not manufactured by a metal. Accordingly, for example, pieces and hinges connected to the heat absorbing case 802 on a reverse side from a third piece 808 can be also made of plastic and resin. A heat absorbing amount is increased and the band is constructed by different materials in a method in which a portion of a predetermined length from the heat absorbing case 802 is formed by a metal and the other portions are formed by plastic and resin. Accordingly, design of the band can be improved.

FIG. 8 is a cross-sectional view showing a structure of a thermoelectric generating electronic timepiece showing a fourth embodiment mode of the present invention. A thermoelectric generator 1101 is a thermoelectric generator for generating electricity by flowing heat to this thermoelectric generator. There is a thermoelectric generator utilizing the Seebeck effect as one example of the thermoelectric generator 1101. The thermoelectric generator 1101 can use a construction in which a P-type thermoelectric material element and an N-type thermoelectric material element are nipped between two insulating substrates, and are connected to each other on these insulating substrates through a conductive substance such as a metal, etc. In this construction, a plurality of thermoelectric material elements are connected in series such as P, N, P, N, P, N, - - - . When a temperature difference is given between both the above substrates, heat flows and electromotive force of a voltage according to the temperature difference is caused. The electromotive force of a high voltage can be obtained by increasing the number of PN connections. The temperature difference for generating electricity is obtained by the difference between a body temperature and a temperature of the outside air when the timepiece is mounted to an arm. A movement 1102 is a movement of a well-known electronic timepiece having an accumulator such as a secondary battery, a capacitor, etc., an oscillating means, a frequency dividing means, a display driving circuit and a display means. Electric energy generated by the thermoelectric generator 1101 is accumulated to the accumulator and is set to driving energy of the movement 1102. Electric power generated by the thermoelectric generator 1101 can be converted to a voltage used to drive the electronic timepiece by using a voltage raising-lowering circuit and can be also accumulated to the accumulator. A windshield glass 1103 is fixed to a heat radiating case 1104. The heat radiating case 1104 is connected to a cold pole 11011 of the thermoelectric generator 1101 and radiates heat radiated from the cold pole 11011 of the thermoelectric generator 1101 to the outside air. A material of the heat radiating case 1104 is preferably formed by a metal such as stainless steel, an iron alloy, aluminum, an aluminum alloy, a copper alloy, a titanium alloy, etc. since these metals easily conduct heat. A heat absorbing case 1106 is connected to a hot pole 11012 of the thermoelectric generator 1101 and conducts heat from the arm to the hot pole 11012 of the thermoelectric generator 1101 when the timepiece is mounted to the arm. A heat insulating case 1105 is arranged between the heat radiating case 1104 and the heat absorbing case 1106, and interrupts heat from the heat absorbing case 1106 so as not to directly conduct this heat to the heat radiating case 1104. The heat insulating case 1105 is desirably formed by a material having high heat insulating effects such as plastic, synthetic resin, etc. A band 1107 is arranged to mount the timepiece to the arm. A material of the band 1107 is desirably constructed by a metal such as stainless steel, aluminum, an aluminum alloy, titanium, a titanium alloy, etc. since these metals easily conduct heat and heat obtained from the arm can be conducted to the heat absorbing case 1106 with reduced loss. A connecting portion 1108 is a portion that connects the heat radiating case 1104 and the band 1107 and is desirably formed by welding, adhesion, connection using a pin, connection using a spring, connection using caulking, connection performed by arranging concave and convex portions, connection using a lever, connection using press-attachment, connection using a screw, connection using a spring bar, connection using a snap operation, connection using a hook, etc. In the connecting portion 1108, it is desirable to directly connect the heat radiating case 1104 and the band 1107 so as to easily conduct heat, but the heat radiating case 1104 and the band 1107 may be also connected to each other through a member capable of easily conducting heat. A composite material of a metal and an organic substance may be also used. It is also effective to arrange a heat radiating portion for increasing radiating efficiency of heat to the atmosphere in one portion of an outer circumference of the heat radiating case 1104 although this construction is not shown in the drawings.

Next, one example of heat radiating effects using the band will be explained. The heat resistance of the radiating case is able to estimate dividing the heat resistance per unit area by the area. The heat resistance of combination of the radiating case and the band connects parallel in that of the radiating case, the band and the contact portion between the radiating case and the band. An area of a heat radiating portion is supposed to be 10 cm$^2$ in the heat radiating case 1104, and is supposed to be 10 cm$^2$ in the band 1107. A thermal resistance per 1 cm$^2$ between the heat radiating portions of the heat radiating case 1104 and the band 1107 and the outside air is supposed to be 500° C./(W·cm$^2$). A thermal resistance in contact between the heat radiating case 1104 and the band 1107 is supposed to be 10° C./W. In the case of only the heat radiating case 1104, the thermal resistance between the heat radiating case 1104 and the outside air becomes about 50° C./W from the above suppositions. In contrast to this, in the case of the heat radiating case 1104 and the band 1107, this thermal resistance becomes about 27.3° C/W so that the thermal resistance can be reduced and heat radiating performance can be improved. Here, such values are calculated by omitting the thermal resistances within the heat radiating case 1104 and the band 1107 since these thermal resistances are small. The thermal resistance between the heat radiating portion and the outside air is changed depending on an arranging environment of the timepiece.

Figure 9:
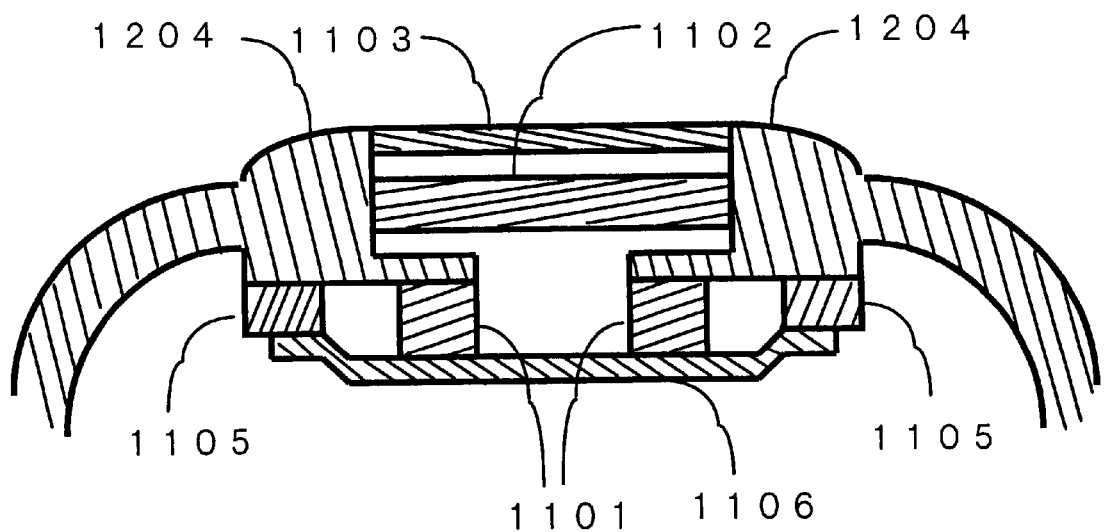
FIG. 9 is a cross-sectional view showing the structure of a thermoelectric generating electronic timepiece showing a fifth embodiment mode of the present invention.

FIG. 9 is a cross-sectional view showing a structure of a thermoelectric generating electronic timepiece showing a fifth embodiment mode of the present invention. In the fifth embodiment mode, loss of thermal connection in a connecting means for connecting the heat radiating case 1104 and the band 1107 can be eliminated by integrating the heat radiating case 1104 and the band 1107 with each other so that a heat radiating portion 1204 is formed. The other constructions are the same as those in the fourth embodiment mode. Accordingly, an explanation of these constructions is omitted here.

Figure 10:
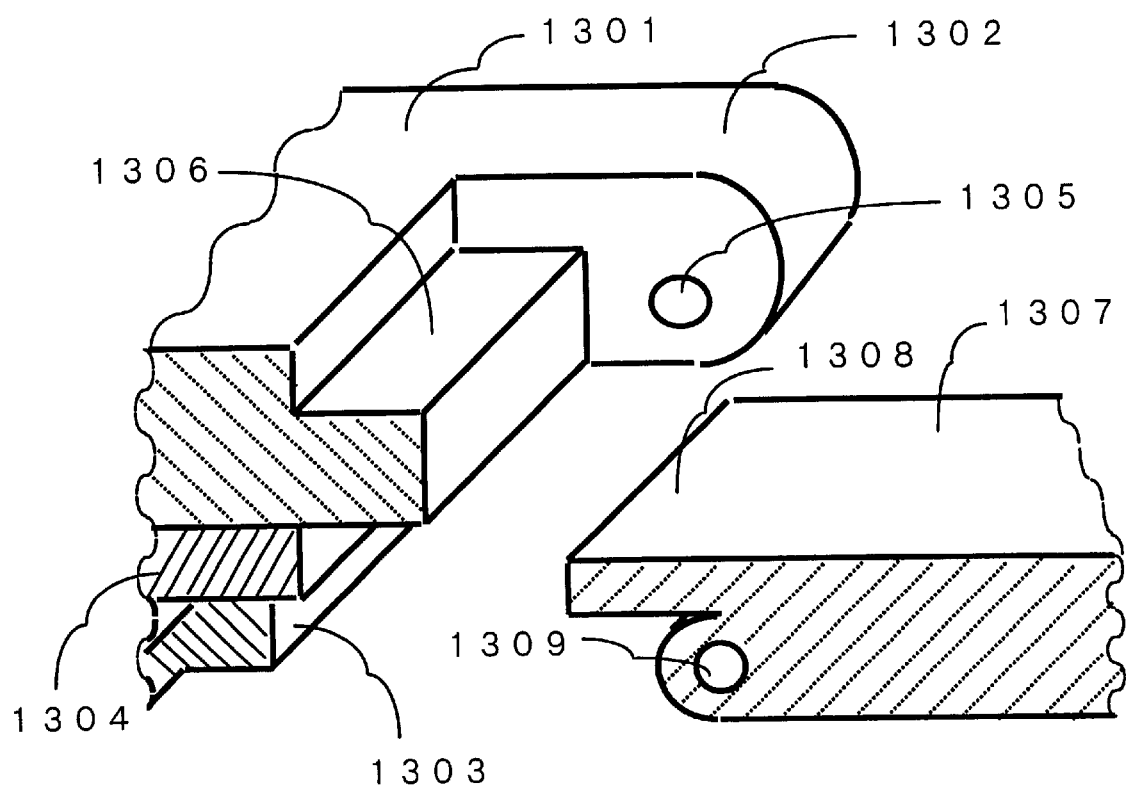
FIG. 10 is a perspective view showing a structure as one example of a connecting portion of a band and a heat absorbing case in the present invention.

FIG. 10 is a perspective view showing a structure as one example of a connecting portion of the band and the heat absorbing case in the present invention. A heat radiating case 1301 is thermally connected to a cold pole of a thermoelectric generator and radiates heat. A heat absorbing case 1303 is thermally connected to a hot pole of the thermoelectric generator and absorbs heat from an arm. The heat absorbing case 1303 is a rear cover. A heat insulating case 1304 insulates heat so as not to directly conduct heat from the heat absorbing case 1303 to the heat radiating case 1301. A handle 1302 is one portion of the heat radiating case and has a hole 1305 for attaching the band thereto. The band 1307 is arranged to mount the timepiece to an arm and is attached to the heat radiating case 1301 by a spring bar. A through hole 1309 is arranged to insert the spring bar into this through hole 1309. The spring bar is inserted into the hole 1305 formed in the handle 1302 through the through hole 1309. The band 1307 is attached to the heat radiating case 1301. A band contact portion 1308 and a case contact portion 1306 come in contact with each other by attaching the band 1307 to the heat radiating case 1301. Heat is easily conducted by this contact so that loss of heat conduction is reduced. Heat is conducted from the heat radiating case 1301 to the band 1307 so that this heat is radiated. Here, a dedicated contact surface is formed, but it is also possible to adopt a structure for making a side surface of the band and a side surface of the handle 1302 come in contact with each other. It is preferable to make these side surfaces come in contact with each other, but heat is also conducted by arranging these side surfaces in proximity to each other instead of the contact of these side surfaces. Further, heat is also conducted from the heat radiating case 1301 to the band 1307 through the spring bar and is radiated.

The heat radiating case 1301 and the band 1307 are connected to each other by the spring bar, but may be also connected to each other by a non-through hole, a screw hole, etc. since a band connecting method except for the spring bar can be used.

Figure 11:
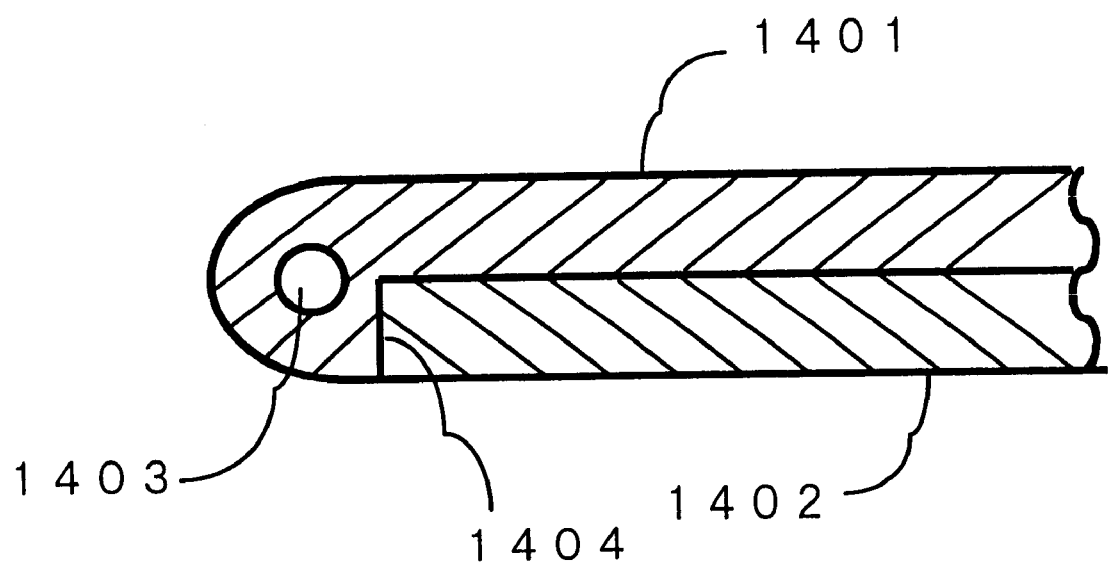
FIG. 11 is a cross-sectional view showing a structure as one example of the band of the present invention.

FIG. 11 is a cross-sectional view showing a structure as one example of the band of the present invention. The band of the present invention is constructed by a heat insulating member 1402 and a heat radiating member 1401. The heat insulating member 1402 is formed by a material having non or bad thermal conductivity such as synthetic resin on a side contacted an arm. The heat radiating member 1401 is formed by of a material having good thermal conductivity such as a metallic material, etc. on a side contacted the outside air. A recessed portion 1404 is formed on an entire lower surface or one portion of the heat radiating member 1401. The heat insulating member 1402 is mounted to the recessed portion 1404 and is fixed to this recessed portion 1404 such that the heat radiating member 1401 and the heat insulating member 1402 are not easily separated from each other by adhesion, welding, etc. A hole 1403 is formed in the heat radiating member 1401 and is generally set to a through hole since a spring bar is inserted into this hole. However, the hole 1403 may be also set to a non-through hole, a screw hole, etc. since a band connecting method except for the spring bar can be also used. The heat insulating member 1402 insulates heat so as not to directly conduct heat from the arm to the heat radiating member 1401. Radiated heat is increased so as to make heat escape from the heat radiating member 1401 to the outside air as much as possible so that more heat can be radiated.

Figure 12:
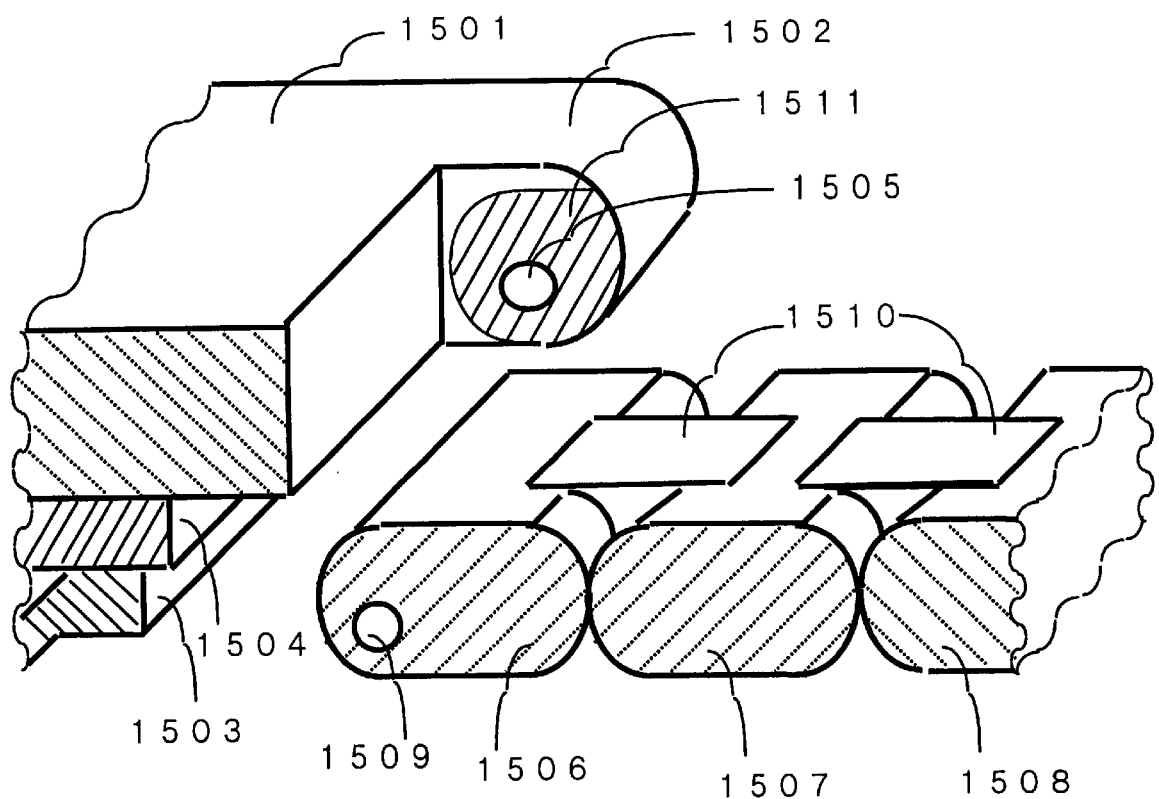
FIG. 12 is a perspective view showing a structure as one example of a connecting portion of a heat absorbing case and a band in the present invention.

FIG. 12 is a perspective view showing a structure as one example of a connecting portion of the heat absorbing case and the band in the present invention. A heat radiating case 1501 radiates heat. A projecting portion 1502 for attaching the band is arranged in the heat radiating case 1501. A hole 1505 for inserting a spring bar thereinto is formed in the projecting portion 1502. The heat radiating case 1501 and the band are connected to each other by using the spring bar. A heat absorbing case 1503 absorbs heat from the arm and is generally a rear cover. A heat insulating case 1504 insulates heat so as not to directly conduct the heat absorbed by the heat absorbing case to the heat radiating case.

Figure 13:
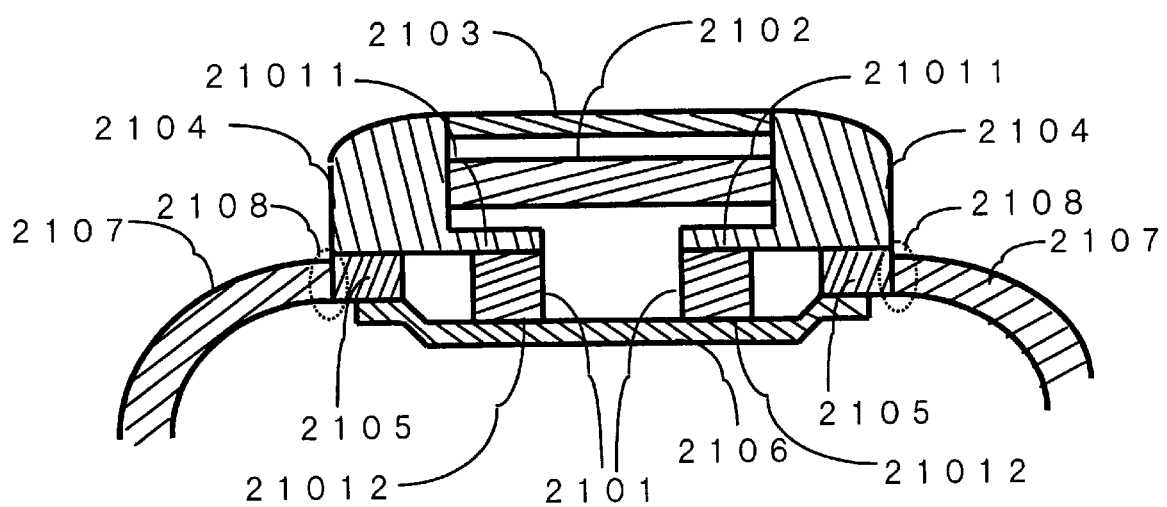
FIG. 13 is a cross-sectional view showing a structure of a thermoelectric generating electronic timepiece showing a sixth embodiment mode of the present invention.

In FIG. 12, only one portion of the band is shown, but the band is constructed by a plurality of pieces 1506, 1507, 1508 and a plurality of hinges 1510 for connecting the respective pieces. The pieces can be respectively moved by the hinges. A through hole 1809 is formed in a first piece 1806 and the first piece 1806 is connected to the heat radiating case 1501 by inserting the spring bar into the through hole 1809. Heat radiated from the band can be utilized by connecting the heat radiating case 1501 and the band so that more heat can be radiated. A temperature difference caused in a thermoelectric generator is increased by increasing a heat radiating amount so that a generated electric amount can be increased. A contact surface 1511 comes in contact with a side surface of the first piece 1506 so as to easily conduct heat. Heat loss can be reduced by manufacturing the pieces and the hinges constituting the band by a metal having good thermal conductivity. Thus, heat can be easily conducted by manufacturing the pieces and the hinges by a metal. Heat can be radiated to a certain extent even when all of the pieces and the hinges are not manufactured by a metal. For example, pieces and hinges connected to the heat radiating case 1501 on a reverse side from a third piece 1508 can be also made of plastic and resin. A heat absorbing amount is increased and the band is constructed by different materials in a method in which a portion of a predetermined length from the heat radiating case 1501 is formed by a metal and the other portions are formed by plastic and resin. Accordingly, design of the band can be improved. FIG. 13 is a cross-sectional view showing a structure of a thermoelectric generating electronic timepiece showing a sixth embodiment mode of the present invention. The thermoelectric generator 2101 is a thermoelectric generator for generating electricity by flowing heat to this thermoelectric generator. There is a thermoelectric generator utilizing the Seebeck effect as one example of the thermoelectric generator 2101. The thermoelectric generator 2101 can use a construction in which a P-type thermoelectric material element and an N-type thermoelectric material element are nipped between two insulating substrates, and are connected to each other on these insulating substrates through a conductive substance such as a metal, etc. In this construction, a plurality of thermoelectric material elements are connected in series such as P, N, P, N, P, N, - - - . When a temperature difference is given between both the above substrates, heat flows and electromotive force of a voltage according to the temperature difference is caused. The electromotive force of a high voltage can be obtained by increasing the number of PN connections. The temperature difference for generating electricity is obtained by the difference between a body temperature and a temperature of the outside air when the timepiece is mounted to an arm. A movement 2102 is a movement of a well-known electronic timepiece having an accumulator such as a secondary battery, a capacitor, etc., an oscillating means, a frequency dividing means, a display driving circuit and a display means. Electric energy generated by the thermoelectric generator 2101 is accumulated to the accumulator and is set to driving energy of the movement 2102. Electric power generated by the thermoelectric generator 2101 can be converted to a voltage used to drive the electronic timepiece by using a voltage raising-lowering circuit and can be also accumulated to the accumulator. A windshield glass 2103 is fixed to a heat radiating case 2104. The heat radiating case 2104 is connected to a cold pole 21011 of the thermoelectric generator 2101 and radiates heat radiated from the cold pole 21011 of the thermoelectric generator 2101 to the outside air. A material of the heat radiating case 2104 is preferably formed by a metal such as stainless steel, an iron alloy, aluminum, an aluminum alloy, a copper alloy, a titanium alloy, etc. since these metals easily conduct heat. A heat absorbing case 2106 is connected to a hot pole 21012 of the thermoelectric generator 2101 and conducts heat from the arm to the hot pole 21012 of the thermoelectric generator 2101 when the timepiece is mounted to the arm. A heat insulating case 2105 is arranged between the heat radiating case 2104 and the heat absorbing case 2106, and interrupts heat from the heat absorbing case 2106 so as not to directly conduct this heat to the heat radiating case 2104. The heat insulating case 2105 is desirably formed by a material having high heat insulating effects such as plastic, synthetic resin, etc. A band 2107 is arranged to mount the timepiece to the arm. A material of the band 2107 is preferably constructed by a heat insulating material such as resin, leather, etc. so as to reduce a thermal influence from the arm, but can be also constructed by using a metal having relatively bad thermal conductivity such as stainless steel, titanium, a titanium alloy, etc. A connecting portion 2108 is a portion that connects the heat insulating case 2105 and the band 2107 and is desirably formed by welding, adhesion, connection using a pin, connection using a spring, connection using caulking, connection performed by arranging concave and convex portions, connection using a lever, connection using press-attachment, connection using a screw, connection using a spring bar, connection using a snap operation, connection using a hook, etc. Further, it is desirable to reduce a contact surface of the connecting portion 2108 so as not to easily conduct heat in the connecting portion 2108. However, the connection may be also performed through a member difficult to conduct heat. Further, a material having bad thermal conductivity may be used by using a composite material of a metal and an organic substance. Thus, no heat conducted from the arm to the band 2107 is directly conducted to the heat radiating case 2104 so that heat loss is reduced and more heat can be supplied to the thermoelectric generator 2101.

Figure 14:
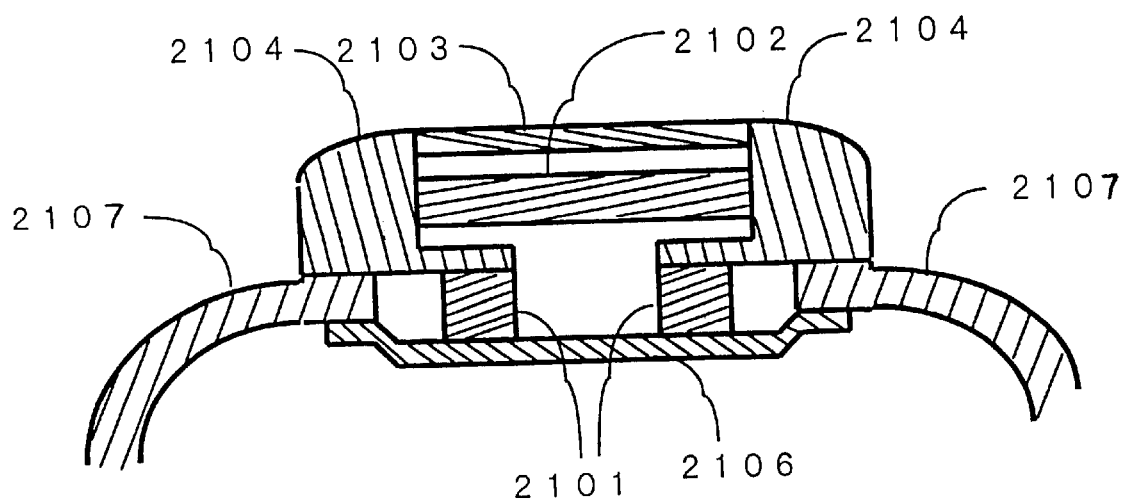
FIG. 14 is a cross-sectional view showing a structure of a thermoelectric generating electronic timepiece showing a seventh embodiment mode of the present invention.

FIG. 14 is a cross-sectional view showing a structure of a thermoelectric generating electronic timepiece showing a seventh embodiment mode of the present invention. In the seventh embodiment mode, a heat insulating case 2106 and a band 2107 are integrated with each other so that heat flowing from the band to the heat radiating case 2106 can be reduced without any connecting means. The other constructions are the same as those in the sixth embodiment mode. Accordingly, an explanation of these constructions is omitted here.

Figure 15:
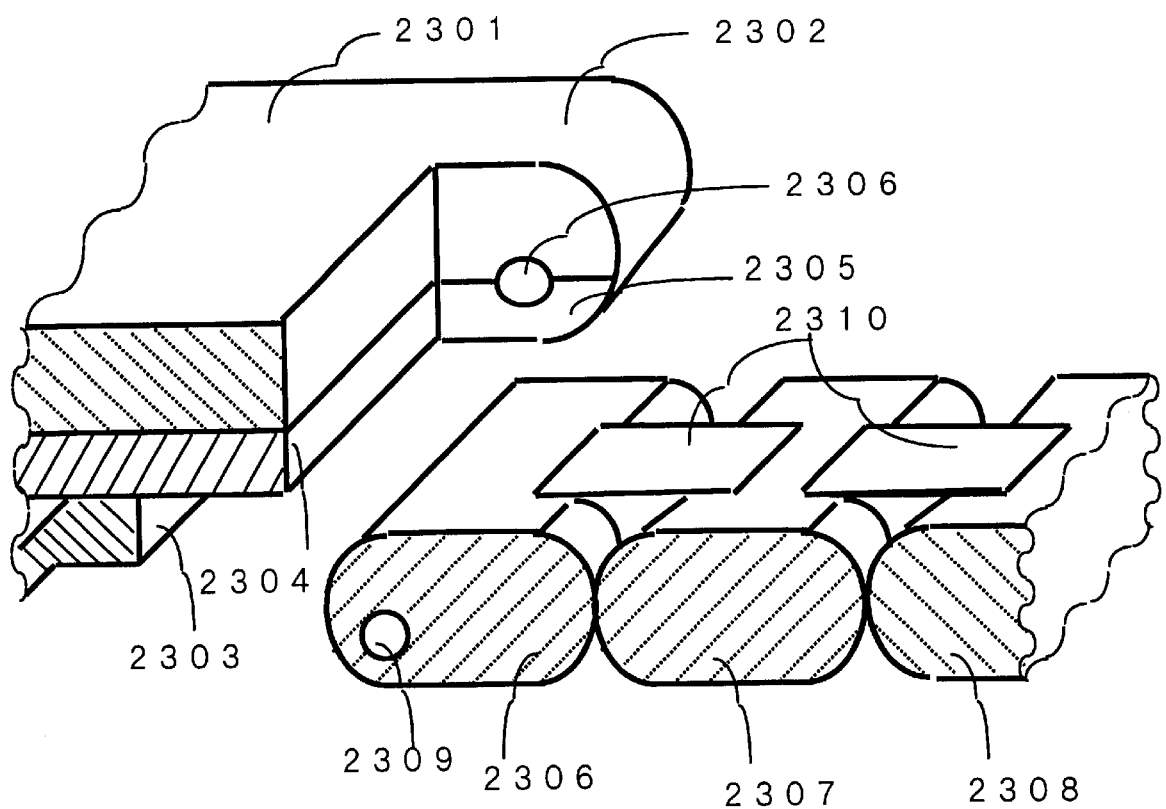
FIG. 15 is a perspective view showing a structure as one example of a connecting portion of a heat insulating case and a band in the present invention.

FIG. 15 is a perspective view showing a structure as one example of a connecting portion of the heat insulating case and the band in the present invention. A heat absorbing case 2303 absorbs heat from an arm and is thermally connected to a hot pole of a thermoelectric generator and supplies this heat to the thermoelectric generator. The heat absorbing case 2303 is generally a rear cover. A heat radiating case 2301 radiates heat to the outside air and is thermally connected to a cold pole of the thermoelectric generator and radiates heat from the thermoelectric generator. A heat insulating case 2304 is a heat insulating member such as plastic, resin, etc. for insulating heat so as not to directly conduct the heat absorbed by the heat absorbing case 2303 to the heat radiating case 2301. A timepiece body and the band are connected to each other by a spring bar. A hole 2306 is formed in each of band attaching portions 2302, 2305 and a spring bar for attaching the band is inserted into this hole 2306. The hole 2306 is bored over the band attaching portion 2305 of the heat insulating case and the band attaching portion 2302 of the heat radiating case. The band attaching portion 2305 of the heat insulating case is one portion of the heat insulating case 2304. The band attaching portion 2302 of the heat radiating case is one portion of the heat radiating case 2301.

In FIG. 15, only one portion of the band is shown. The band is constructed by a plurality of pieces 2306, 2307, 2308 and a plurality of hinges 2310 for connecting the respective pieces. The pieces can be respectively moved by the hinges. A through hole 2309 is formed in a first piece 2306 and the spring bar is inserted into the hole 2306 formed in each of the band attaching portions 2302, 2305 so that the pieces are connected. The respective pieces of the band are desirably manufactured by a heat insulating material such as resin, leather, etc. in which no heat is easily conducted from the band to the heat radiating case 2301. At least the first piece 2306 as a piece of the band closest to a timepiece body is manufactured by resin and leather in which no heat is easily conducted. Accordingly, heat insulation can be performed so as not to conduct heat to the heat radiating case 2301. Thus, a thermal influence from the band to the heat radiating case can be reduced by constructing one portion of the band by a heat insulating member. The first piece 2306 can be also manufactured by resin, and a second piece 2307 and a third piece 2308 can be also manufactured by a metal. Thus, it is possible to adopt a method in which a portion of a predetermined length from the timepiece body is formed by resin and the other portions are formed by a metal. In such a method, the band can be attached to the heat radiating case 2301.

Figure 16:
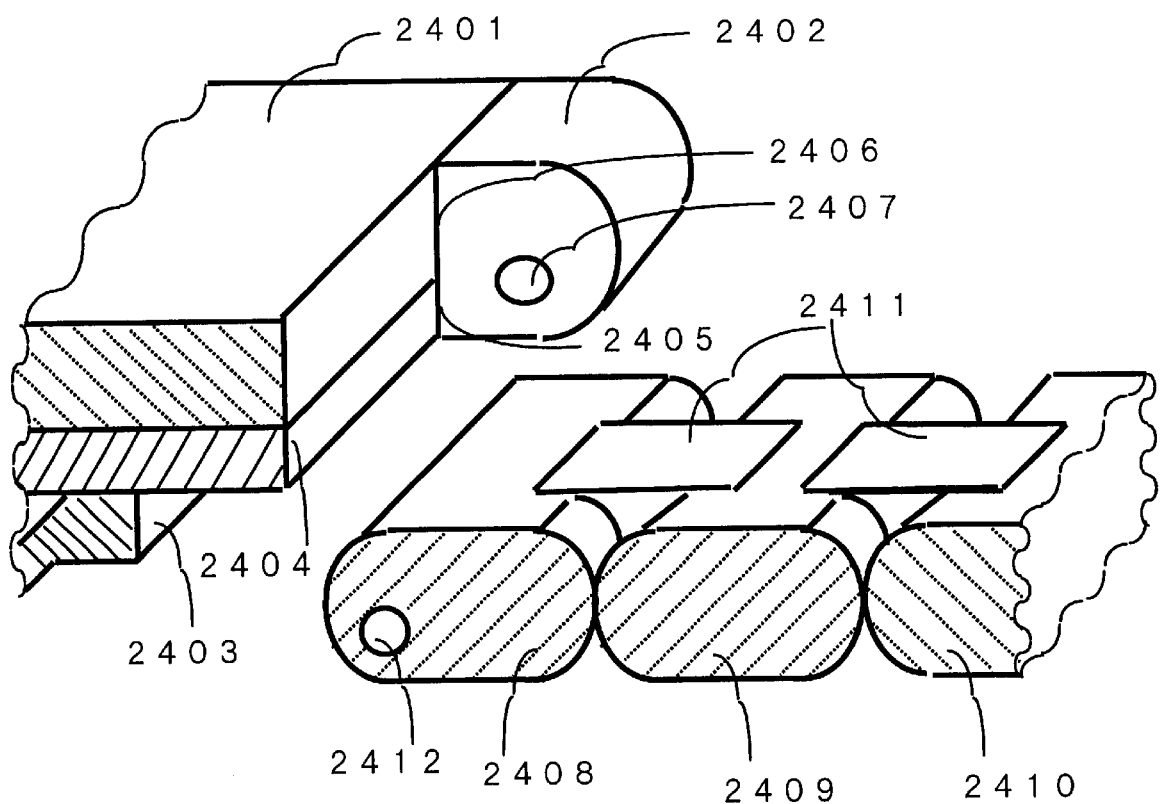
FIG. 16 a perspective view showing a structure as one example of the connecting portion of the heat insulating case and the band in the present invention.

FIG. 16 is a perspective view showing a structure as one example of a connecting portion of the heat insulating case and the band in the present invention. A heat absorbing case 2403 absorbs heat from an arm and is thermally connected to a hot pole of a thermoelectric generator and supplies this heat to the thermoelectric generator. The heat absorbing case 2403 is generally a rear cover. A heat radiating case 2401 radiates heat to the outside air and is thermally connected to a cold pole of the thermoelectric generator and radiates heat from the cold pole of the thermoelectric generator. A heat insulating case 2404 is a heat insulating member such as plastic, resin, etc. for insulating heat so as not to directly conduct the heat absorbed by the heat absorbing case 2403 to the heat radiating case 2401. A timepiece body and the band are connected to each other by a spring bar. A hole 2407 is formed in a band attaching portion 2402 and the spring bar for attaching the band is inserted into this hole 2407. The band attaching portion 2402 is connected to the heat insulating case 2404 and the heat radiating case 2401 on a first connecting surface 2405 and a second connecting surface 2406 by adhesion, welding, caulking, screws, etc. such that no band attaching portion 2402 is easily detached from the heat insulating case 2404 and the heat radiating case 2401. The band attaching portion 2402 is desirably formed by a heat insulating material such as plastic, synthetic resin, etc. difficult to conduct heat so as to reduce a thermal influence from the band to the heat radiating case.

In FIG. 16, only one portion of the band is shown. The band is constructed by a plurality of pieces 2408, 2409, 2410 and a plurality of hinges 2411 for connecting the respective pieces. The pieces can be respectively moved by the hinges. A through hole 2412 is formed in a first piece 2408 and the first piece 2408 is connected to the band attaching portion 2402 through a spring bar. The respective pieces of the band are desirably manufactured by resin and leather in which no heat is easily conducted. However, since heat is insulated by the band attaching portion 2402, the band may be also constructed by a metal easy to conduct heat. Thus, in FIG. 16, the band attaching portion 2402 is formed in the heat insulating case 2404 and the heat radiating case 2401. However, the band can be attached from an arbitrary place of an outer mounting case of the timepiece by arranging the heat insulating band attaching portion 2402.

Figure 17:
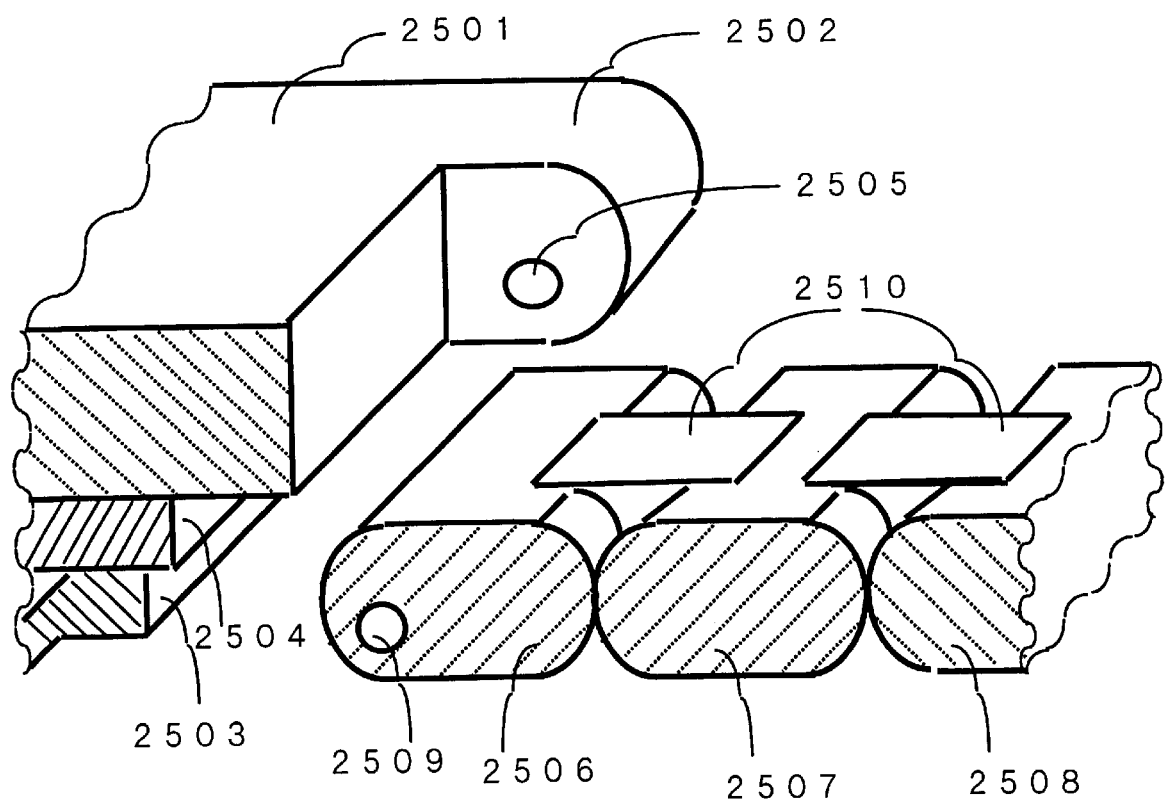
FIG. 17 is a perspective view showing a structure as one example of the connecting portion of the heat insulating case and the band in the present invention.

FIG. 17 is a perspective view showing a structure as one example of a connecting portion of the heat insulating case and the band in the present invention. A heat absorbing case 2503 absorbs heat from an arm and is thermally connected to a hot pole of a thermoelectric generator and supplies this heat to the thermoelectric generator. The heat absorbing case 2503 is generally a rear cover. A heat radiating case 2501 radiates heat to the outside air and is thermally connected to a cold pole of the thermoelectric generator and radiates heat from the cold pole of the thermoelectric generator. A heat insulating case 2504 is a heat insulating member such as plastic, resin, etc. for insulating heat so as not to directly conduct the heat absorbed by the heat absorbing case 2503 to the heat radiating case 2501. A timepiece body and the band are connected to each other by a spring bar. A hole 2505 is formed in a band attaching portion 2502 and the spring bar for attaching the band is inserted into this hole 2505. The band attaching portion 2502 is one portion of the heat radiating case 2501.

In FIG. 17, only one portion of the band is shown. The band is constructed by a plurality of pieces 2506, 2507, 2508 and a plurality of hinges 2510 for connecting the respective pieces. The pieces can be respectively moved by the hinges. A through hole 2509 is formed in a first piece 2506 and the first piece 2506 is connected to the band attaching portion 2502 by using the spring bar. The respective pieces of the band are desirably manufactured by resin and leather in which no heat is easily conducted. At least the first piece 2506 as a piece of the band closest to a timepiece body is manufactured by resin in which no heat is easily conducted. Accordingly, heat insulation can be performed so as not to conduct heat to the heat radiating case 2501. Thus, a thermal influence from the band to the heat radiating case can be reduced by constructing one portion of the band by a heat insulating member. The first piece 2506 can be also manufactured by resin, and a second piece 2507 and a third piece 2508 can be also manufactured by a metal. Thus, it is possible to adopt a method in which a portion of a predetermined length from the timepiece body is formed by resin and the other portions are formed by a metal.

The band can be attached from an arbitrary place of an outer mounting case of the timepiece by using the heat insulating band.

Figure 18:
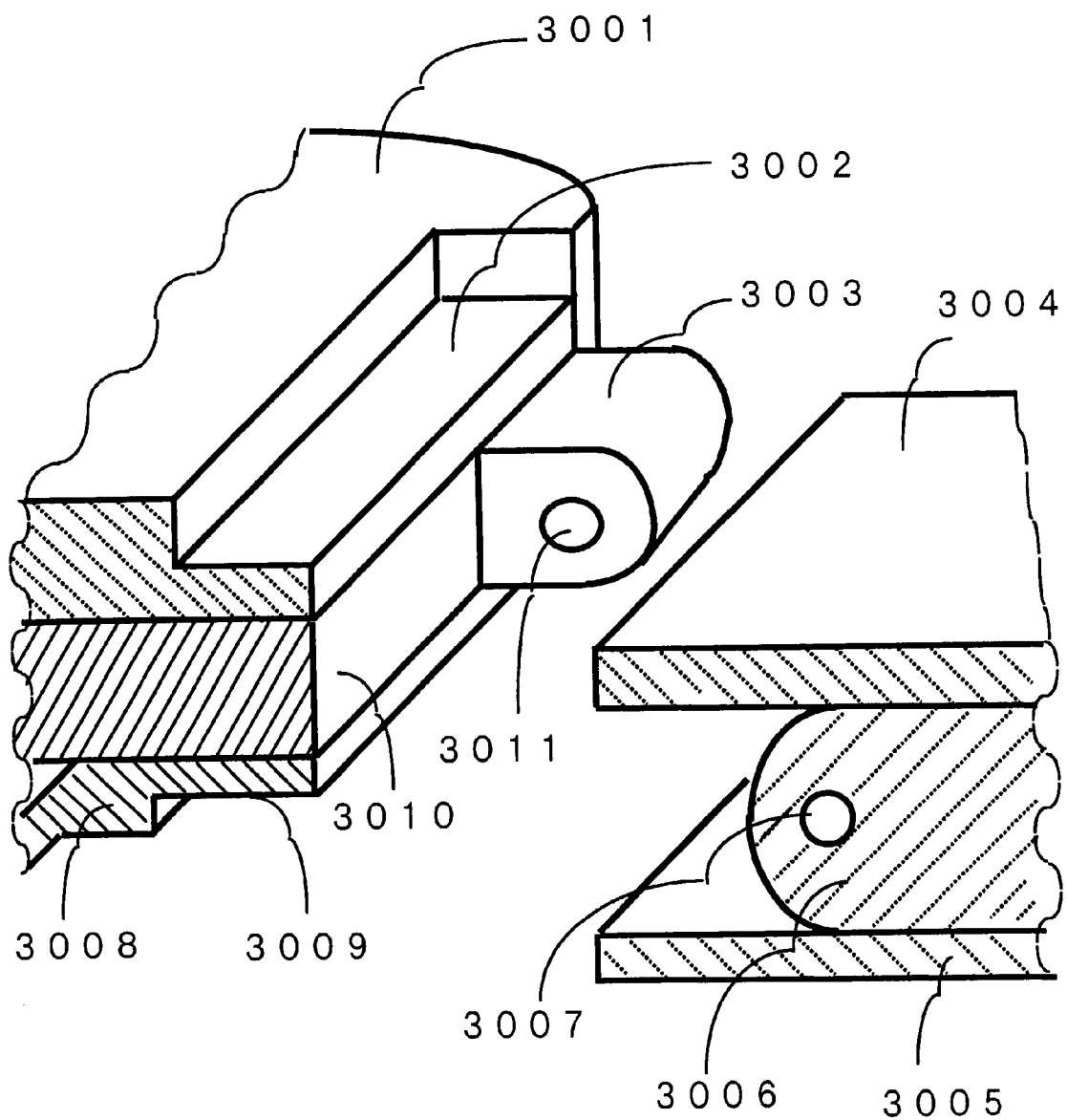
FIG. 18 is a view showing a structure of a thermoelectric generating electronic timepiece showing an eighth embodiment mode of the present invention.

FIG. 18 is a view showing a structure of a thermoelectric generating electronic timepiece showing an eighth embodiment mode of the present invention.

A heat radiating case 3001 has a heat radiating band connecting portion 3002 as a portion contacted a band. A rear cover 3008 is a heat absorbing portion for absorbing heat from an arm. The rear cover 3008 has a heat absorbing band connecting portion 3009 as a portion contacted the band. A heat insulating case 3010 is arranged to thermally insulate the heat radiating case 3001 and the rear cover 3008 and is formed by using plastic and resin in which no heat is easily conducted. A spring bar receiver 3003 is formed in the heat insulating case 3010 to receive a spring bar for connection with the band and has a structure having a hole 3011 for receiving the spring bar. The band and the cases are connected to each other by inserting the spring bar into a spring bar hole 3007. The band is constructed by a heat radiating band 3004, a heat insulating band 3006 and a heat absorbing band 3005. The heat radiating band 3004 comes in contact with the heat radiating case 3001 in the heat radiating band connecting portion 3002 and is thermally connected to the heat radiating case 3001. A heat radiating area is increased by thermally connecting the heat radiating band 3004 to the heat radiating case 3001 so that a heat radiating amount is increased. Similar to the cases, a material of the heat radiating band 3004 preferably uses a metal so as to easily conduct heat. The heat absorbing band 3005 comes in contact with the rear cover 3008 in the heat absorbing band connecting portion 3009 and is thermally connected to the rear cover 3008. A heat absorbing amount is increased by conducting heat absorbed from the arm by the heat absorbing band 3005 to the rear cover 3008. Similar to the cases, a material of the heat absorbing band 3005 preferably uses a metal so as to easily conduct heat. The heat absorbing band 3005 comes in contact with the arm, or is arranged in proximity to the arm so that the heat absorbing band 3005 absorbs heat from the arm. The heat insulating band 3006 is arranged between the heat absorbing band 3005 and the heat radiating band 3004 so as not to directly conduct heat.

Figure 19:
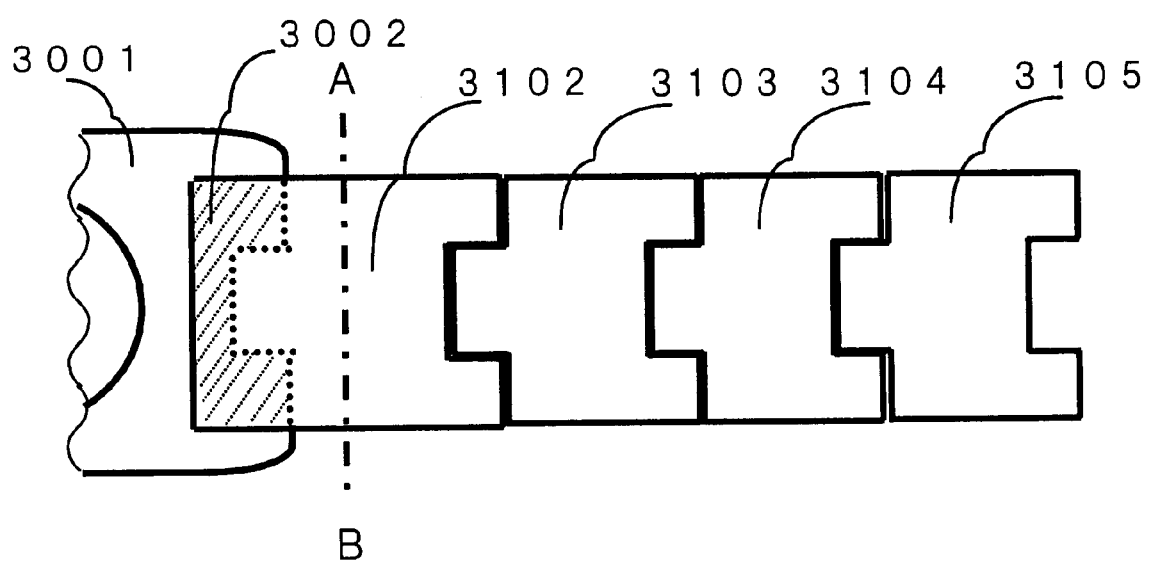
FIG. 19 is a plan view showing an electronic timepiece with the thermoelectric generator showing the eighth embodiment mode of the present invention.

FIG. 19 is a plan view seen from a side of the heat radiating case in the eighth embodiment mode. The heat radiating case 3001 is a case for radiating heat to the atmosphere. A first piece 3102 is one of pieces of the band and is connected to the heat radiating case 3001 in the heat radiating band connecting portion 3002.

A second piece 3103, a third piece 3104 and a fourth piece 3105 are pieces of the band.

Figure 20:
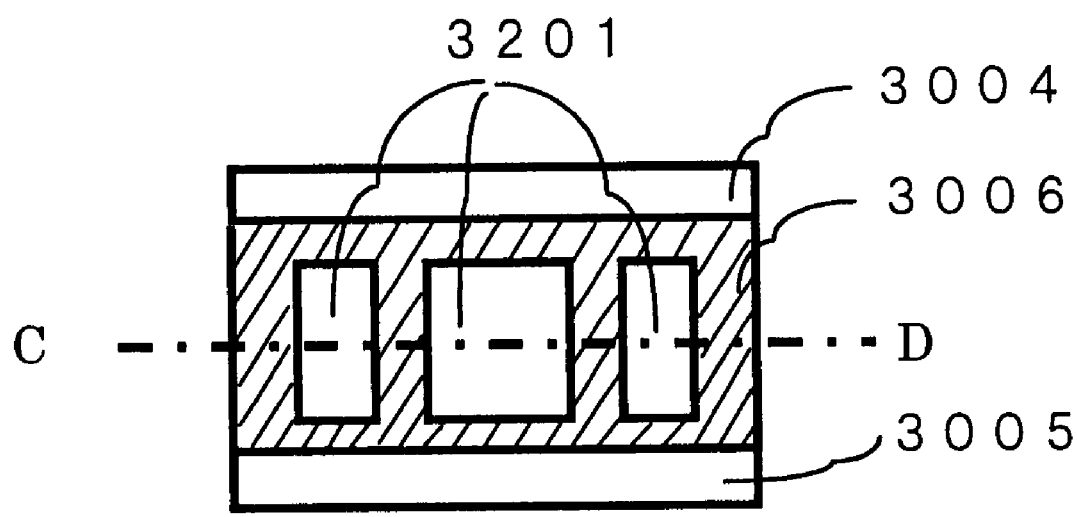
FIG. 20 is a view showing a first example illustrating a section of the band.

FIG. 20 is a first example showing a section of the band cut along a one-dotted chain line A–B of FIG. 19.

The heat radiating band 3004 and the heat absorbing band 3005 are thermally insulated in the heat insulating band 3006. An air layer portion 3201 is a space formed in one portion of the heat insulating band 3006 to increase heat insulating effects. This space is divided into a plurality of spaces to hold strength.

Figure 21:
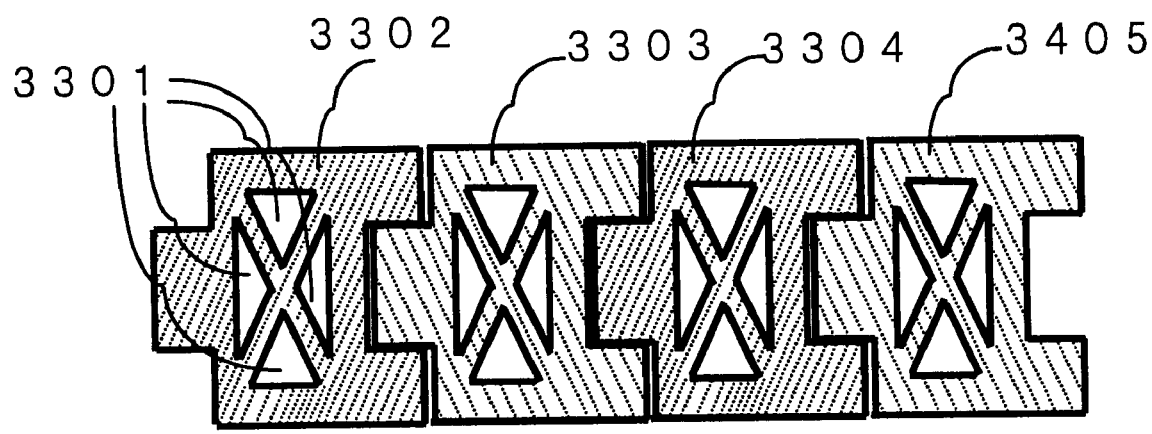
FIG. 21 is a view showing one example of a heat insulating portion.

FIG. 21 shows a section of the band shown in FIG. 19 and cut along a one-dotted chain line C–D of FIG. 20. A section 3302 of a first heat insulating piece shows a heat insulating portion of the first piece 3102. A section 3303 of a second heat insulating piece shows a heat insulating portion of a first piece 3103. A section 3304 of a third heat insulating piece shows a heat insulating portion of a first piece 3104. A section 3305 of the third heat insulating piece shows a heat insulating portion of a first piece 3105. A space is formed except for one portion of the heat insulating pieces to improve heat insulating effects while strength is held. For example, a wall is made in an X-shape and an air heat insulating portion 3301 is formed.

Figure 22:
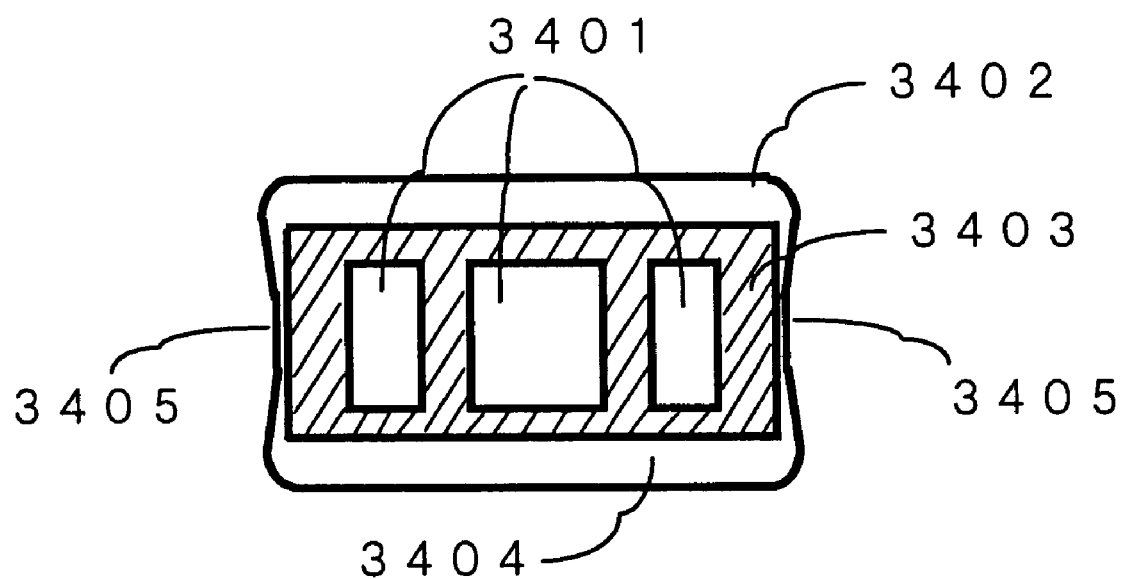
FIG. 22 is a view showing a second example illustrating a section of the band.

FIG. 22 shows a second example showing a section of the band. A heat radiating portion 3402 and a heat absorbing portion 3404 are integrated with each other by a band piece connecting portion 3405 in which a cross section is reduced so as not to easily conduct heat. A spatial portion 3401 is formed in a heat insulating material 3403 to improve heat insulating effects. The heat absorbing portion 3404 comes in contact with an arm and absorbs heat from the arm and the heat radiating portion 3402 radiates heat to the atmosphere so that the heat absorbing portion 3404 and the heat radiating portion 3402 are respectively thermally connected to a heat absorbing case 3008 and a heat radiating case 3001 and performances of heat absorption and heat radiation are improved. Further, heat insulating effects can be improved by removing the heat insulating material 3004.

The present invention has effects described below in the first to third embodiment modes as explained above.

Absorption of heat from the band is added in addition to absorption of heat from the heat absorbing case so that more heat can be absorbed. A generated electric amount is increased since a quantity of heat flowing to a thermoelectric generator is increased.

Loss caused in heat transfer between the band and the heat absorbing case can be reduced by integrating the band and the heat absorbing case.

Heat radiated from the band can be conducted to the heat absorbing case by separating the band and the heat radiating case and separating the band and the heat insulating case without directly conducting this heat to the heat radiating case and the heat insulating case so that a much quantity of heat can be given to the thermoelectric generator.

A heat absorbing amount absorbed by the band can be increased and a heat radiating amount radiated by the band can be restrained by using a material having good thermal conductivity on a heat absorbing side of the band and using a material for restraining the heat radiation on a heat radiating side. Accordingly, a whole heat quantity capable of conducting heat from the band to the heat absorbing case can be increased so that a much quantity of heat can be given to the thermoelectric generator.

A band portion of a predetermined length from the heat absorbing case is formed by a metal to absorb heat from an arm and the other portions of the band are formed by resin so that a much quantity of heat can be given to the thermoelectric generator.

Further, transfer loss due to a connecting means of the band and the heat absorbing case can be reduced by using a heat transfer member having a good heat transfer property in the connecting means. Accordingly, heat absorbed from the band can be transferred to the heat absorbing case with reduced loss and a much quantity of heat can be given to the thermoelectric generator.

Further, a much quantity of heat can be given to the thermoelectric generator and design can be also improved by constituting the band by different materials.

Further, heat absorbed from the band can be directly transferred to the heat absorbing case by arranging a contact portion in at least one of the heat absorbing case and the band so that a much quantity of heat can be given to the thermoelectric generator.

Rotation of the band can be allowed to a certain extent and the absorbed heat can be transmitted to the heat absorbing case with reduced loss as much as possible by arranging a proximate portion in at least one of the heat absorbing case and the band. Accordingly, a much quantity of heat can be given to the thermoelectric generator.

Further, a contact area for absorbing heat from the heat absorbing case can be increased by fixedly attaching a heat absorbing plate to the heat absorbing case, or setting one portion of the heat absorbing case to a heat absorbing portion so that a heat absorbing amount can be increased.

The fourth to fifth embodiment modes have effects described below.

In accordance with a thermoelectric generating electronic timepiece in the present invention, heat is radiated from the band in addition to radiation of heat from the heat radiating case so that more heat can be radiated. Accordingly, a quantity of heat flowing to the thermoelectric generator is increased so that a generated electric amount is increased.

Further, loss caused in heat transfer between the band and the heat radiating case can be reduced by integrating the band and the heat radiating case.

Further, heat transfer loss can be reduced by making the band and the heat radiating case come in contact with each other and arranging the band and the heat radiating case in proximity to each other. Accordingly, a quantity of heat flowing to the thermoelectric generator is increased so that a generated electric amount is increased.

Further, heat can be transferred to the heat radiating case by separating the band and the heat absorbing case and separating the band and the heat insulating case without directly transmitting heat radiated from the heat absorbing case and the heat insulating case. Accordingly, a much quantity of heat can be given to the thermoelectric generator.

Further, heat transfer loss can be reduced by manufacturing a connecting means for connecting the band and the heat radiating case by a metal. Accordingly, a quantity of heat flowing to the thermoelectric generator is increased so that a generated electric amount is increased.

The band may be constructed by a metal, but heat transfer loss can be further reduced by forming the band by a composite material of resin and a metal. Further, since heat is conducted even when the band is constructed by resin, heat collected by the band can be also conducted to the heat absorbing case.

Further, an influence of heat from the arm on the heat radiation can be reduced by constituting an arm side of the band by a metal and constituting an outside air side of the band by resin. Accordingly, a quantity of heat flowing to the thermoelectric generator is increased so that a generated electric amount is increased.

Further, design is improved by using different materials in a material of the band.

Further, heat can be directly transferred to the band by arranging a contact portion in at least one of the heat radiating case and the band. Accordingly, heat loss due to connection is reduced so that a much quantity of heat can be given to the thermoelectric generator.

Rotation of the band can be allowed to a certain extent and absorbed heat can be transmitted to the heat radiating case with reduced loss as much as possible by arranging a proximate portion in at least one of the heat radiating case and the band. Accordingly, a much quantity of heat can be given to the thermoelectric generator.

Thus, a heat radiating amount is increased by utilizing radiation of heat from the band so that generated electric power can be increased.

The sixth to seventh embodiment modes have effects described below.

A reduction in thermal resistance from the arm to the heat radiating case is prevented by a structure for reducing a quantity of heat transferred from the arm to the band and the heat radiating case. Further, a reduction in a generated electric amount can be prevented by preventing a reduction in temperature difference caused in the thermoelectric generator.

Parts can be also saved by integrating the band and the heat insulating case with each other.

It is further difficult to transfer heat by manufacturing a connecting means by an organic substance such as plastic, etc. so that the reduction in the generated electric amount can be prevented.

It is also difficult to transfer heat by constructing the band by an organic substance such as resin, leather, etc. so that the reduction in the generated electric amount can be prevented.

The band can be connected to a timepiece body in its arbitrary position by using a heat insulating material in the band. Accordingly, the reduction in the generated electric amount can be prevented without reducing heat radiating performance by heat from the arm.

Thus, a quantity of heat transferred from the arm to the heat radiating case is reduced by attaching the band to a heat insulating member or the heat insulating case so that the reduction in the generated electric amount can be prevented.

The eighth embodiment mode has effects described below.

Absorbed heat and radiated heat can be increased by dividing the band into a heat absorbing portion and a heat radiating portion in a heat insulating portion so that the generated electric amount can be increased.

Further, heat insulating effects can be increased by setting one portion of the heat insulating portion to an air layer while strength is held.

What is claimed is:

1. A thermoelectric generating electronic timepiece comprising:
    a thermoelectric generator for generating electric power in response to a temperature difference thereacross;
    a heat radiating case thermally connected to a cold pole of the thermoelectric generator for radiating heat;
    a heat absorbing case thermally connected to a hot pole of the thermoelectric generator for absorbing heat;
    a heat insulating case for thermally insulating the heat absorbing case and the heat radiating case;
    a band for securing the thermoelectric generating electronic timepiece to the arm of a user, the band having a heat absorbing member thermally connected to the heat absorbing case for absorbing heat and a heat insulating member for restraining radiation and transfer of heat; and
    connecting means for connecting the heat absorbing case to the band.

2. A thermoelectric generating electronic timepiece as claimed in claim 1; wherein the heat absorbing case and the band are integrally connected to one another.

3. A thermoelectric generating electronic timepiece as claimed in claim 1; wherein the band and the heat radiating case are separated from each other.

4. A thermoelectric generating electronic timepiece as claimed in claim 1; wherein the band and the heat insulating case are separated from each other.

5. A thermoelectric generating electronic timepiece as claimed in claim 1; wherein the connecting means comprises a heat transfer member.

6. A thermoelectric generating electronic timepiece as claimed in claim 1; wherein one of the heat absorbing case and the band has a contact portion for contacting the other of the heat absorbing case and the band.

7. A thermoelectric generating electronic timepiece as claimed in claim 1; wherein one of the heat absorbing case and the band has a cover portion for covering a portion of the other of the heat absorbing case and the band.

8. A thermoelectric generating electronic timepiece as claimed in claim 1; further comprising a heat absorbing plate connected to the heat absorbing case for absorbing heat from the arm of the user.

9. A thermoelectric generating electronic timepiece as claimed in claim 1; wherein the heat absorbing case has a heat absorbing portion disposed on a lower surface thereof for absorbing heat from the arm of the user.

10. A thermoelectric generating electronic timepiece as claimed in claim 1; wherein the connecting means has a contact portion for contacting the heat absorbing case and the band.

11. A thermoelectric generating electronic timepiece as claimed in claim 1; further comprising a timepiece movement having a display for displaying time; and storage means for storing electric power generated by the thermoelectric generator and for supplying the electric power to the timepiece movement.

12. A thermoelectric generating electronic timepiece comprising:

a thermoelectric generator for generating electric power in response to a temperature difference thereacross;

a heat radiating case thermally connected to a cold pole of the thermoelectric generator for radiating heat;

a heat absorbing case thermally connected to a hot pole of the thermoelectric generator for absorbing heat;

a heat insulating case for thermally insulating the heat absorbing case and the heat radiating case;

a band for securing the thermoelectric generating electronic timepiece to the arm of a user, the band having a heat radiating member thermally connected to the heat radiating case for radiating heat and a heat insulating member for insulating heat from the arm of the user; and connecting means for connecting the heat radiating case to the band.

13. A thermoelectric generating electronic timepiece as claimed in claim 12; wherein the heat radiating case and the band are integrally connected to one another.

14. A thermoelectric generating electronic timepiece as claimed in claim 12; wherein the band and the heat absorbing case are separated from each other.

15. A thermoelectric generating electronic timepiece as claimed in claim 12; wherein the band and the heat insulating case are separated from each other.

16. A thermoelectric generating electronic timepiece as claimed in claim 12; wherein the connecting means comprises a heat transfer member.

17. A thermoelectric generating electronic timepiece as claimed in claim 12; wherein one of the heat radiating case and the band has a contact portion for contacting the other of the heat radiating case and the band.

18. A thermoelectric generating electronic timepiece as claimed in claim 12; wherein one of the heat radiating case and the band has a cover portion for covering a portion of the other of the heat radiating case and the band.

19. A thermoelectric generating electronic timepiece as claimed in claim 12; wherein the connecting means has a contact portion for contacting the band and the heat radiating case.

20. A thermoelectric generating electronic timepiece as claimed in claim 12; further comprising a timepiece movement having a display for displaying time; and storage means for storing electric power generated by the thermoelectric generator and for supplying the electric power to the timepiece movement.

21. A thermoelectric generating electronic timepiece comprising:

a thermoelectric generator for generating electric power in response to a temperature difference thereacross;

a heat radiating case thermally connected to a hot pole of the thermoelectric generator for absorbing heat;

a heat insulating case for thermally insulating the heat absorbing case and the heat radiating case;

a band for securing the thermoelectric generating electronic timepiece to the arm of a user, the band having a heat absorbing portion, a heat radiating portion and a heat insulating portion; and connecting means for connecting the heat insulating case to the band.

22. A thermoelectric generating electronic timepiece as claimed in claim 21; wherein the heat insulating member and the band are integrally connected to one another.

23. A thermoelectric generating electronic timepiece as claimed in claim 21; wherein the band and the heat radiating case are separated from each other.

24. A thermoelectric generating electronic timepiece as claimed in claim 21; wherein the band and the heat absorbing case are separated from each other.

25. A thermoelectric generating electronic timepiece as claimed in claim 21; wherein at least one portion of the band comprises a heat insulating member for insulating transfer of heat.

26. A thermoelectric generating electronic timepiece as claimed in claim 21; wherein the connecting means comprises a heat insulating member.

27. A thermoelectric generating electronic timepiece as claimed in claim 21; further comprising a space formed in a part of the heat insulating portion.

28. A thermoelectric generating electronic timepiece as claimed in claim 21; wherein the heat radiating portion of the band and the heat radiating case are thermally connected in contact with one another.

29. A thermoelectric generating electronic timepiece as claimed in claim 21; wherein the heat absorbing portion of the band and the heat absorbing case are thermally connected in contact with one another.

30. A thermoelectric generating electronic timepiece as claimed in claim 21; wherein the heat absorbing portion of the band is disposed in contact with the arm of the user during use of the thermoelectric generating electronic timepiece.

31. A thermoelectric generating electronic timepiece as claimed in claim 21; further comprising a timepiece movement having a display for displaying time; and storage means for storing electric power generated by the thermoelectric generator and for supplying the electric power to the timepiece movement.

32. A thermoelectric generating electronic timepiece as claimed in claim 21; wherein the heat radiating portion of the band and the heat radiating case are disposed proximate one another.

33. A thermoelectric generating electronic timepiece as claimed in claim 21; wherein the heat absorbing portion of the band and the heat absorbing case are disposed proximate one another.

34. A thermoelectric generating electronic timepiece comprising:

display means for displaying time;

an electronic timepiece circuit for driving the display means to display time;

a thermoelectric generator for generating electric power in response to a temperature difference across the thermoelectric generator;

electrical power storage means for storing electric power generated by the thermoelectric generator and for supplying the electric power to the electronic timepiece circuit; and means for applying a temperature difference across the thermoelectric generator to cause the same to generate electric power, the means for applying comprising a heat radiating case thermally connected to a cold pole of the thermoelectric generator for radiating heat, a heat absorbing case thermally connected to a hot pole of the thermoelectric generator for absorbing heat, a heat insulating case disposed between the heat absorbing case and the heat radiating case, and a securing member for securing the thermoelectric generating electronic timepiece to the body of a user, the securing member having a heat absorbing member thermally connected to the heat absorbing case and a heat insulating member for restraining radiation and transfer of heat.

35. A thermoelectric generating electronic timepiece as claimed in claim 34; wherein the heat absorbing case and the band are formed of a single piece of material.

\* \* \* \* \*